(12) United States Patent
Matsuoka et al.

(10) Patent No.: US 7,789,577 B2
(45) Date of Patent: Sep. 7, 2010

(54) COATING AND DEVELOPING SYSTEM, COATING AND DEVELOPING METHOD AND STORAGE MEDIUM

(75) Inventors: Nobuaki Matsuoka, Koshi (JP); Takahiro Hashimoto, Koshi (JP); Katsuhiro Tsuchiya, Tokyo-To (JP); Shinichi Hayashi, Koshi (JP); Yasushi Hayashida, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 252 days.

(21) Appl. No.: 12/103,884

(22) Filed: Apr. 16, 2008

(65) Prior Publication Data

US 2008/0268383 A1 Oct. 30, 2008

(30) Foreign Application Priority Data

Apr. 27, 2007 (JP) .............................. 2007-119430

(51) Int. Cl.
G03D 5/00 (2006.01)
G03F 1/00 (2006.01)
B05D 3/12 (2006.01)
B05D 3/00 (2006.01)

(52) U.S. Cl. ........................ 396/611; 396/604; 430/322; 430/331; 427/240; 427/331

(58) Field of Classification Search .................. 396/611
See application file for complete search history.

(56) References Cited

U.S. PATENT DOCUMENTS

| 7,241,061 | B2 | 7/2007 | Akimoto et al. | 396/611 |
| 2005/0271382 | A1* | 12/2005 | Ogata et al. | 396/611 |
| 2006/0165408 | A1 | 7/2006 | Akimoto et al. | 396/564 |
| 2007/0065145 | A1 | 3/2007 | Kitamura | 396/611 |
| 2008/0241403 | A1* | 10/2008 | Matsuoka et al. | 427/331 |
| 2008/0267619 | A1* | 10/2008 | Matsuoka | 396/611 |
| 2009/0311632 | A1* | 12/2009 | Takeguchi et al. | 430/322 |

FOREIGN PATENT DOCUMENTS

JP 2006-203075 8/2006

* cited by examiner

*Primary Examiner*—Melissa J Koval
(74) *Attorney, Agent, or Firm*—Oblon, Spivak, McClelland, Maier & Neustadt, L.L.P.

(57) ABSTRACT

A coating and developing system that includes two rotating members having parallel horizontal axes of rotation and disposed longitudinally opposite to each other, a carrying passage forming mechanism extended between the rotating members to form a carrying passage, and capable of moving along an orbital path to carry a wafer supported thereon, a sending-in transfer unit disposed at the upstream end of the carrying passage, a sending-out transfer unit disposed at the downstream end of the carrying passage, a developer pouring nozzle for pouring a developer onto the wafer, a cleaning nozzle for pouring a cleaning liquid onto the wafer, and a gas nozzle for blowing a gas against the wafer. The developer pouring nozzle, the cleaning nozzle, and the gas nozzle are arranged in a direction in which the wafer is carried along the carrying passage between the upstream and the downstream end of the carrying passage.

20 Claims, 16 Drawing Sheets

COATING AND DEVELOPING SYSTEM, COATING AND DEVELOPING METHOD AND STORAGE MEDIUM

BACKGROUND OF THE INVENTION

1. Field of the Invention

The present invention relates to a coating and developing system for coating a substrate, such as a semiconductor wafer or an LCD substrate, namely, a glass substrate for a liquid crystal display, with a resist solution by a coating process and processing the substrate by a developing process after exposure, a coating and developing method to be carried out by the coating and developing system, and a storage medium.

2. Description of the Related Art

A manufacturing process for manufacturing a semiconductor device or an LCD substrate forms a resist patter on a substrate by photolithography. Photolithography includes a series of steps of coating a surface of a substrate, such as a semiconductor wafer (hereinafter, referred to as "wafer") with a resist film by applying a resist solution to the surface, exposing the resist film to light through a photomask, and processing the exposed resist film by a developing process to form a desired pattern.

Generally, those processes are carried out by a resist pattern forming system constructed by connecting an exposure system to a coating and developing system for coating a surface of a substrate with a resist solution and developing an exposed film. Such a resist pattern forming system is proposed in, for example, JP-A 2006-203075. In such a coating and developing system, an area in which modules for processing a substrate before the substrate is subjected to an exposure process, and an area in which modules for processing the substrate processed by the exposure system are vertically arranged in layers to further increase the processing rate of the coating and developing system, carrying devices are installed respectively in those areas to improve carrying efficiency by reducing load on the carrying devices so that the throughput of the coating and developing system may be increased.

Referring to FIG. 17, showing this known resist pattern forming system, a carrier block S1, a processing block S2 and an interface block arranged in that order are connected. The processing block S2 is built by stacking up developing blocks B1 and B2 for carrying out a developing process, a coating block B4 for carrying out a resist solution application process, and antireflection film forming blocks B3 and B5 for carrying out an antireflection film forming process before and after the resist solution application process. The blocks B1 to B5 of the processing block S2 are provided with wet-processing units for carrying out wet processes, such as the developing process, the resist solution application process and the chemical solution application process for applying a chemical solution for forming an antireflection film, shelf units formed by stacking up processing units for carrying out processes before and after the wet processes, carrying devices A1 to A5 for carrying wafers W to and from the modules of the wet-processing units and the shelf units, and exclusive transfer arms for transferring wafers W to and from the blocks B1 to B5.

A transfer arm C installed in the carrier block S1 carries a wafer W to the processing block S2, and the carrying devices A1 to A5 and transfer arms carry the wafer W to the desired processing units. Thus loads on the transfer arm C, the carrying devices A1 to A5, and the transfer arms are reduced to improve the throughput of the resist pattern forming system.

Although this resist pattern forming system can process wafers at a throughput on the order of, for example, 180 wafers/hr, the market demands for a system capable of processing wafers at a high throughput in the range of 200 to 250 wafers/hr. The inventors of the present invention have been engaged in developing a resist pattern forming system capable of achieving such a high throughput.

In this resist pattern forming system, each of the developing blocks B1 and B2 is provided with a developing unit formed by arranging, for example, three developing modules for carrying out the developing process. To achieve the developing process, each developing module holds a wafer W on, for example, a spin chuck, spreads a developer over a surface of the wafer W by pouring the developer onto the surface of the wafer W while the spin chuck holding the wafer W is rotated, removes the developer from the wafer W a predetermined after the developer has been poured onto the wafer W by pouring a cleaning liquid onto the surface of the wafer W, and dries the surface of the wafer W by rotating the spin chuck holding the wafer W at a high rotating speed. The main arms A1 and A2 of the developing blocks B1 and B2 transfer a wafer W not yet processed to the spin chucks of the developing modules of the developing blocks B1 and B2 and receives the wafer W processed by the developing process from the spin chucks, respectively.

The number of processing units, for processing a wafer W before and after processing the wafer W by the developing process, included in each of the developing blocks B1 and B2 is greater than that of the processing units of the coating block B4. Therefore, a large load is imparted on the main arms A1 and A2 that carries a wafer W to and from the processing units and the developing units. Consequently, the processing rates of the blocks B3 to B5 are controlled by the processing rates of the developing blocks B1 and B2, whereby the throughput of the resist pattern forming system may be reduced. The inventors of the present invention is making efforts to improve the throughput of the resist pattern forming system through the improvement of the throughput of the developing blocks B1 and B2.

SUMMARY OF THE INVENTION

The present invention has been made under such circumstances and it is therefore an object of the present invention to provide a technique for improving the throughput of a coating and developing system.

The present invention provides a coating and developing system, including: a film forming unit block disposed behind a carrier block to form films including a resist film on a substrate carried in a carrier delivered to the carrier block; an interface block disposed behind the film forming unit block to transfer the substrate provided with the films including the resist film to an exposure system; and a developing unit block put on the film forming unit block to process the substrate returned from the exposure system through the interface block by a developing process and provided with a substrate carrying passage along which the substrate is carried from the interface block toward the carrier block, and the substrate processed by the developing process is transferred to the carrier block; wherein the developing unit block is provided with developing modules for processing a substrate by the developing process, and a substrate carrying means for carrying a substrate to and receiving a substrate from the developing modules; and each of the developing modules is provided with a pair of rotating members respectively having horizontal axes of rotation parallel to each other and disposed longitudinally opposite to each other, a carrying passage forming mechanism extended between the rotating members, capable of moving along an orbital path and forming a part of the carrying passage for the substrate supported thereon, a sending-in transfer unit disposed at an upstream end of the carrying passage to transfer a substrate from the substrate carrying means to the carrying passage forming mechanism, a sending-out transfer unit disposed at a downstream end of the carrying passage to transfer a substrate from the carrying passage forming mechanism to the substrate carrying means, a developer pouring nozzle for pouring a developer onto a substrate, a cleaning liquid pouring nozzle for pouring a cleaning liquid onto a substrate and a gas blowing nozzle for blowing a gas against a substrate arranged in that order from an upstream side toward a downstream side of the carrying passage between the upstream and the downstream end of the carrying passage.

The carrying passage forming mechanism includes, for example, a plurality of bar-shaped carrying members, for supporting a substrate thereon, extending parallel to the axes of rotation, and a pair of timing belts connected to the opposite ends of the carrying members and capable of moving along the orbital path. At least one of the pair of rotating members may be driven by a motor to move the timing belts along the orbital path. The timing belts of the carrying passage forming mechanism may be provided with electromagnets arranged at least on their outer surfaces such that N poles and S poles are arranged alternately, and driving electromagnets, for moving the timing belts along the orbital path, having changeable magnetic properties and arranged so that N poles and S poles are arranged alternately. The driving electromagnets drive the timing belts by repulsion acting between the electromagnets without touching the timing belts. A mesh fabric may be interposed between a substrate on the carrying passage and the developer pouring nozzle so as to move together with the substrate.

The substrate carrying means may include a sending-in substrate carrying means for transferring a substrate to the sending-in transfer unit, and a sending-out substrate carrying means for receiving a substrate from the sending-out transfer unit. The developing module may be formed so that the substrate carrying passage formed by the carrying passage forming mechanism extends along the substrate carrying passage in the developing unit block, the sending-in transfer unit is on the side of the interface block, and the sending-out transfer unit is on the side of the carrier block. The developing unit block may be provided with a shelf unit including a plurality of pretreatment modules for processing a substrate before the substrate is processed by the developing process, and a plurality of posttreatment modules for processing a substrate processed by the developing process. The shelf unit may be disposed opposite to the developing modules with respect to the substrate carrying passage in the developing unit block.

In the carrying passage in the developing unit block, the sending-in substrate carrying means may be disposed on the side of the interface block, the sending-out substrate carrying means may be disposed on the side of the carrier block, a substrate may be transferred to and received from the pretreatment modules of the shelf unit by the sending-in substrate carrying means, and a substrate may be transferred to and received from the posttreatment modules of the shelf unit by the sending-out substrate carrying means.

A coating and developing method according to the present invention for forming films including a resist film on a substrate carried in a carrier delivered to a carrier block by a film forming unit block disposed behind the carrier block, carrying the substrate through an interface block disposed behind the film forming unit block to an exposure system, processing the substrate returned through the interface block from the exposure system by a developing process by a developing unit block put on the film forming unit block and provided with a substrate carrying passage extending from the interface block toward the carrier block, and transferring the substrate to the carrier block, the developing unit block being provided with developing modules for processing a substrate by the developing process, and a substrate carrying means for carrying a substrate to and receiving a substrate from the developing modules, and each of the developing modules being provided with a pair of rotating members respectively having horizontal axes of rotation parallel to each other, and disposed longitudinally opposite to each other, a carrying passage forming mechanism extended between the rotating members, capable of moving along an orbital path and forming a part of the carrying passage for the substrate supported thereon, said coating and developing method includes the steps of: transferring a substrate from the substrate carrying means to the carrying passage forming mechanism by a sending-in transfer unit disposed at an upstream end of the carrying passage; pouring a developer onto the substrate while the substrate is being carried downstream by the carrying passage forming mechanism; pouring a cleaning liquid onto the substrate while the substrate is being carried downstream by the carrying passage forming mechanism; blowing a dry gas against the substrate while the substrate is being carried downstream by the carrying passage forming mechanism; transferring the substrate from the carrying passage forming mechanism to the substrate carrying means after moving the substrate to a sending-out transfer unit disposed at a downstream end of a carrying passage by the carrying passage forming mechanism; and moving the carrying passage forming mechanism not carrying any substrate along the orbital path to return the carrying passage forming mechanism from the sending-out transfer unit to the sending-in transfer unit.

Preferably, the substrate carrying means includes a sending-in substrate carrying means and a sending-out substrate carrying means, the substrate is transferred from the sending-in substrate carrying means to the carrying passage forming mechanism at the sending-in transfer unit, and the substrate is transferred from carrying passage forming mechanism to the sending-out substrate carrying means at the sending-out transfer unit.

The present invention provides a storage medium storing a computer program to be executed by a coating and developing system that forms films including a resist film on a substrate received from a carrier block, and processes the substrate processed by an exposure process by a developing process; wherein the computer program is a set of instructions specifying steps of the coating and developing method According to the present invention, substrates are transferred successively from the substrate carrying means of the developing unit block to the sending-in transfer unit, the substrates are moved successively downstream along the carrying passage, the substrates are subjected to a developer pouring process, a substrate cleaning process and a substrate drying process while the substrates are carried along the carrying passage, and the substrates processed by all the processes are transferred successively through the sending-out transfer unit to the substrate carrying means in the developing module of the developing unit block. Therefore, the substrates can be processed by the developing process in a flow production mode in the developing module. Since a plurality of substrates can be continuously processed by the developing process, the coating and developing system can achieve a high throughput. Since the substrate carrying means can access the developing module at the sending-in transfer unit and the sending-out transfer unit, load on the substrate carrying means can be reduced to improve the throughput of the coating and developing system.

DESCRIPTION OF THE PREFERRED EMBODIMENTS

Figure 1:
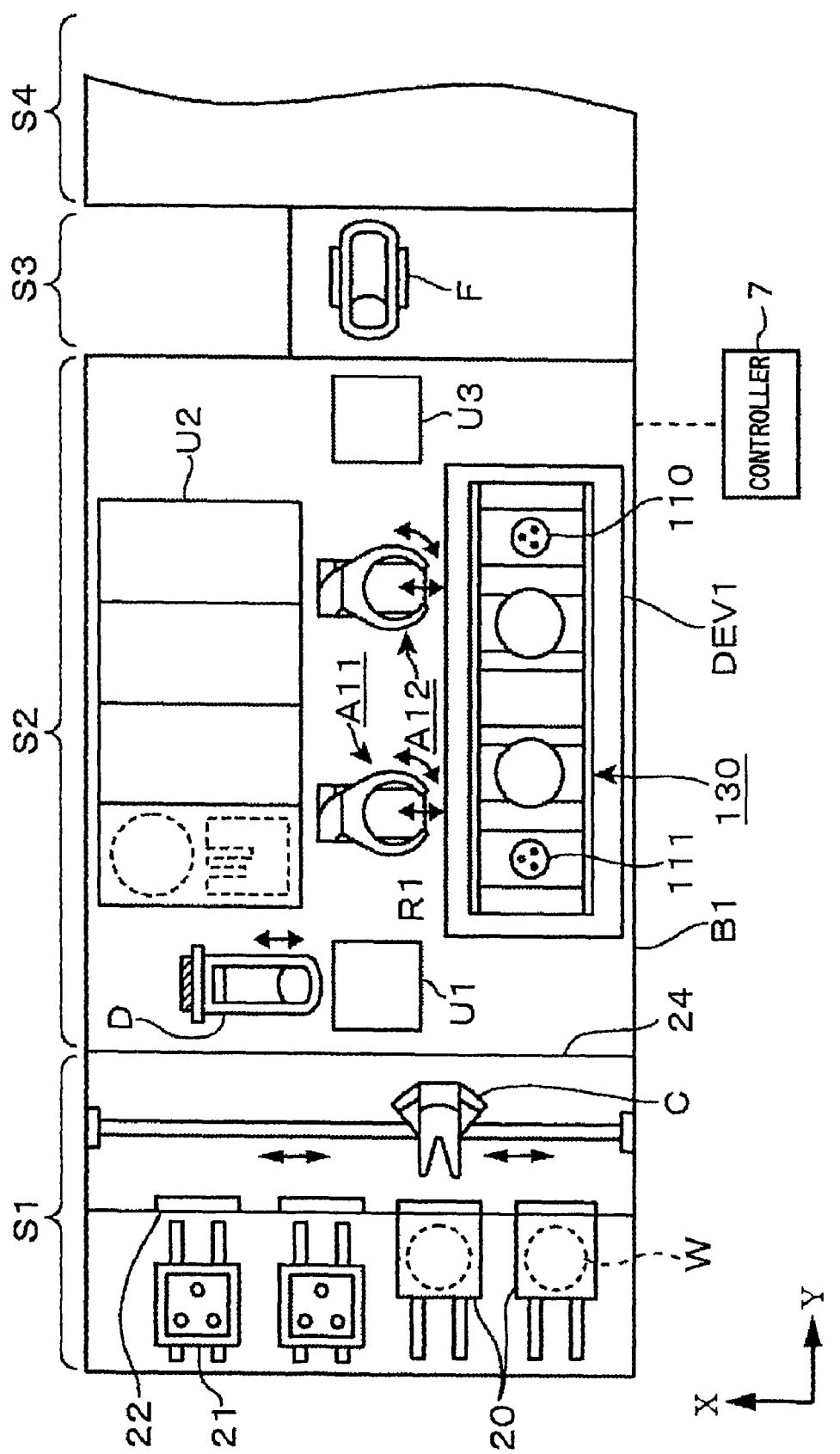
FIG. 1 is a plan view of a coating and developing system in a first embodiment according to the present invention.
Figure 2:
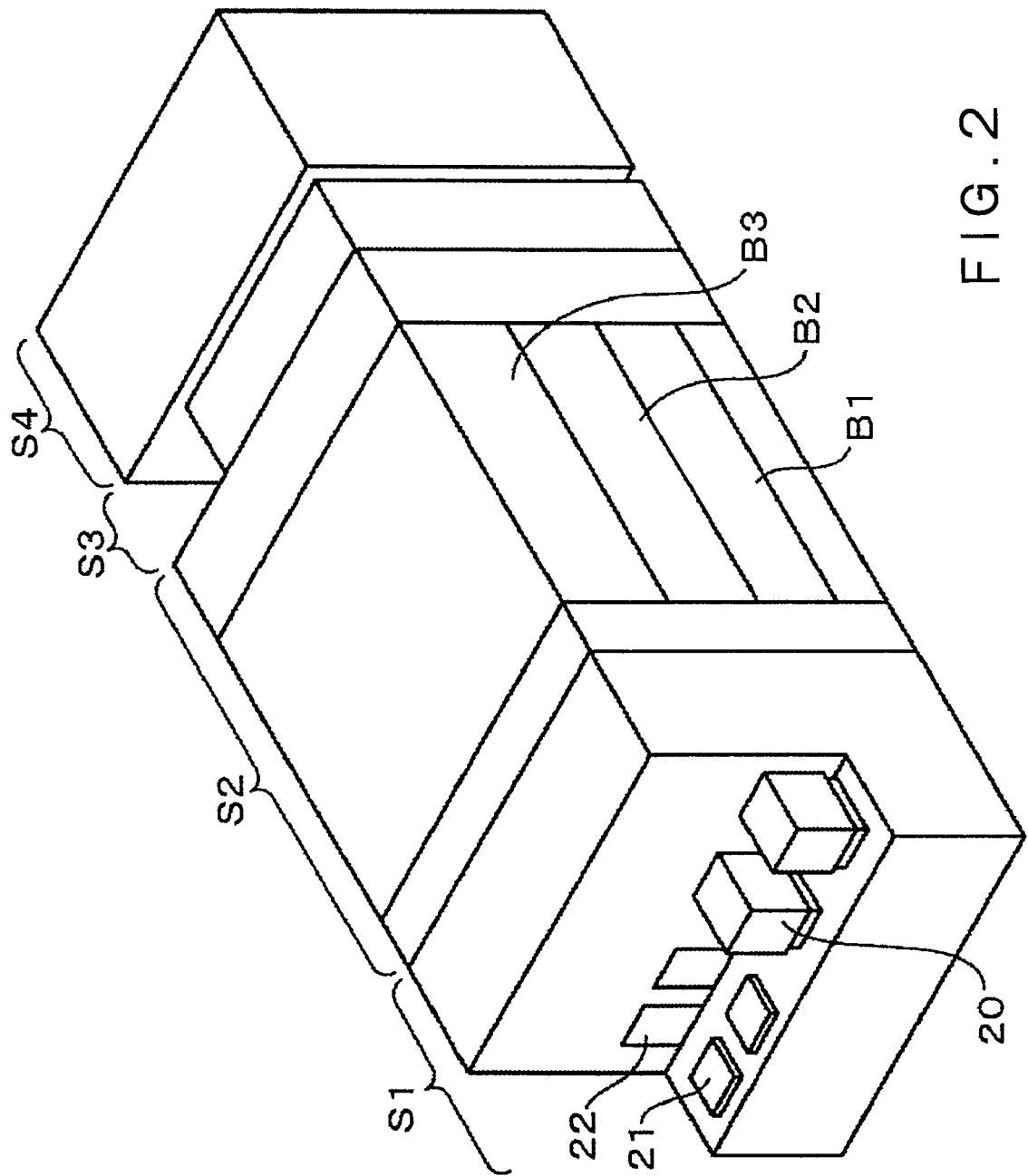
FIG. 2 is a perspective view of the coating and developing system in the first embodiment.
Figure 3:
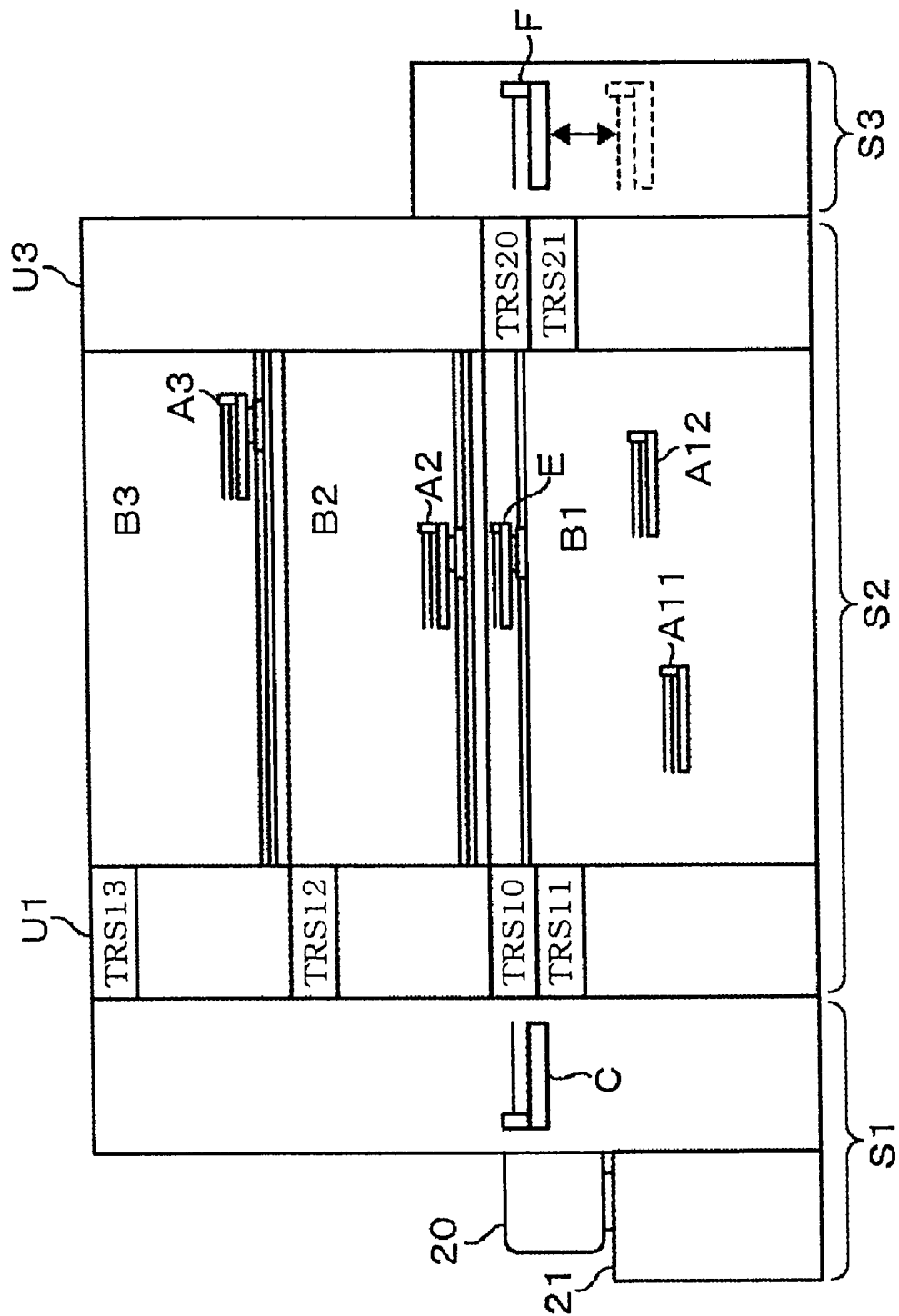
FIG. 3 is a sectional side elevation of the coating and developing system in the first embodiment.

Resist pattern forming systems respectively including coating and developing systems in preferred embodiments according to the present invention will be described with reference to the accompanying drawings. FIGS. 1, 2 and 3 are a plan view, a schematic perspective view and a schematic side elevation, respectively, of a resist pattern forming system including a coating and developing system in a first embodiment according to the present invention. The resist pattern forming system has a carrier block S1 to which a carrier 20 is delivered and from which the carrier 20 is sent out, a processing block S2, an interface block S3 and an exposure system S4.

The carrier block S1 is provided with a carrier platform 21 on which a plurality of carriers 20 are supported, a wall disposed behind the carrier platform 21 and provided with closable openings 22, and a transfer arm C, namely, a transfer means, for taking out a wafer W from the carrier 20 through the closable opening 22. The transfer arm C can move in longitudinal and vertical directions, can turn about a vertical axis, and can move laterally along a direction in which carriers 20 are arranged to carry a wafer W to and receive a wafer W from transfer module TRS11 included in a unit block B1.

The processing block S2 surrounded by a box 24 and is disposed behind and joined to the carrier block S1. The processing block S2 has a plurality of unit blocks, for example, three unit blocks B1 to B3 arranged longitudinally therein. In this embodiment, the unit blocks B1 to B3 are, from the bottom upward, a developing layer (DEV layer) B1, and two coating layers (COT1 layer COT2 layer ) B2 and B3 for carrying out a resist film forming process. The DEV layer B1, the COT1 layer B2 and the COT2 layer B3 are separated from each other. The COT1 layer B2 and the COT2 layer B3 are unit blocks for carrying out film forming processes, and the DEV layer B1 is a unit block for carrying out a developing process.

The unit blocks B1, B2 and B3 are similar in construction to each other. Each of the unit blocks B1, B2 and B3 is provided with a wet-processing module for carrying out a wet process, and processing modules for carrying out a pretreatment process before the wet process, and a post treatment process after the wet process. The unit blocks B1, B2 and B3 are provided with main arms A11 and A12, a main arm A2, and a main arm A3, namely, substrate carrying means, respectively, for carrying a wafer W to and from the wet-processing modules and the processing modules.

As shown in FIGS. 1 and 3, a transfer shelf unit U1 is disposed in areas in the unit blocks B1, B2 and B3 adjacent to the carrier block S1 so as to be accessible by the transfer arm C and the main arms A11, A12, A2 and A3. The shelf unit U1 has, for example, first transfer units respectively for the unit blocks. The first transfer units are placed in layers. A wafer W is transferred to and from each of the unit blocks through the first transfer unit. A transfer arm D capable of moving longitudinally and vertically carries a wafer W to and from each of the first transfer units.

The construction of the COT1 layer B2 will be described with reference to FIGS. 4 and 5 as an example of the construction of the unit blocks B1 to B3. A carrying area R1 in which a wafer W is carried extends longitudinally, namely, in a Y-direction in FIGS. 4 and 5, in a substantially central part of the COT1 layer B2. A coating unit 31 provided with coating modules, namely, wet-processing modules, for coating a surface of a wafer W with a resist solution is disposed on the right-hand side, as viewed from the side of the carrier block S1, of the carrying area R1.

In the coating unit 31, a plurality of, for example, three coating modules COT1 to COT3 are arranged along the Y-direction in a processing vessel 30 so as to face the carrying area R1. Each of the coating modules COT11 to COT13 pours a resist solution, namely, a coating solution, through a common pouring nozzle onto a wafer W held by suction in a horizontal position on, for example, a spin chuck, spreads the resist solution over the surface of the wafer W by rotating the wafer W to coat the surface of the wafer W with a resist solution film. The processing vessel 30 is provided with openings 33A to 33C (FIG. 5) at positions respectively corresponding to the coating modules COT1 to COT3. The main arm A2 carries a wafer W to and receives a wafer W from the coating modules COT1 to COT3 through the openings 33A to 33C.

A shelf unit U2 is disposed opposite to the coating unit 31 with respect to the carrying area R1. The shelf unit U2 has processing modules arranged in two layers and four rows. The processing modules are those for carrying out pretreatments to which a wafer W is subjected before the same is processed by the coating unit 31 and for carrying out posttreatments to which a wafer W is subjected after the same has been processed by the coating unit 31. The processing modules include heating and cooling modules LHP for heating a wafer W coated with a resist solution film and cooling the heated wafer W, temperature adjusting modules CPL for adjusting the temperature of a wafer W to a predetermined temperature, and edge exposure modules WEE.

The heating and cooling module LHP is provided with a heating plate 34 for heating a wafer W supported thereon, and a cooling plate 35 serving also as a carrying arm. The cooling plate 35 transfers a wafer W between the main arm A2 and the heating plate 34. The heating and cooling module LHP is formed by combining a heating module and a cooling module. The heating module and the cooling module may be built separately. The temperature adjusting module CPL is provided, for example, with a water-cooled cooling plate. As shown in FIG. 5, each of those modules including the heating and cooling modules LHP and the temperature adjusting modules CPL is contained in a processing vessel 36 having a front wall facing the carrying area R1 and provided with openings 37 through which a wafer W is carried into and out of the processing vessel 36.

The shelf unit U1 of the COT1 layer B2 has a transfer module TRS12, namely, the first transfer unit. The main arm A2 of the COT1 layer B2 and the transfer arm D can access the transfer module TRS12. The main arm A2 will be described. The main arm A2 can carry a wafer W to and receive a wafer W from all the modules, in which a wafer W is placed, in the COT1 layer B2, such as the coating modules COT1 to COT3, and the transfer module TRS12 of the shelf unit U1, and the processing modules of the shelf unit U2. The main arm A2 can move forward and backward, can vertically move, can turn about a vertical axis and can move in directions parallel to the Y-direction.

Figure 4:
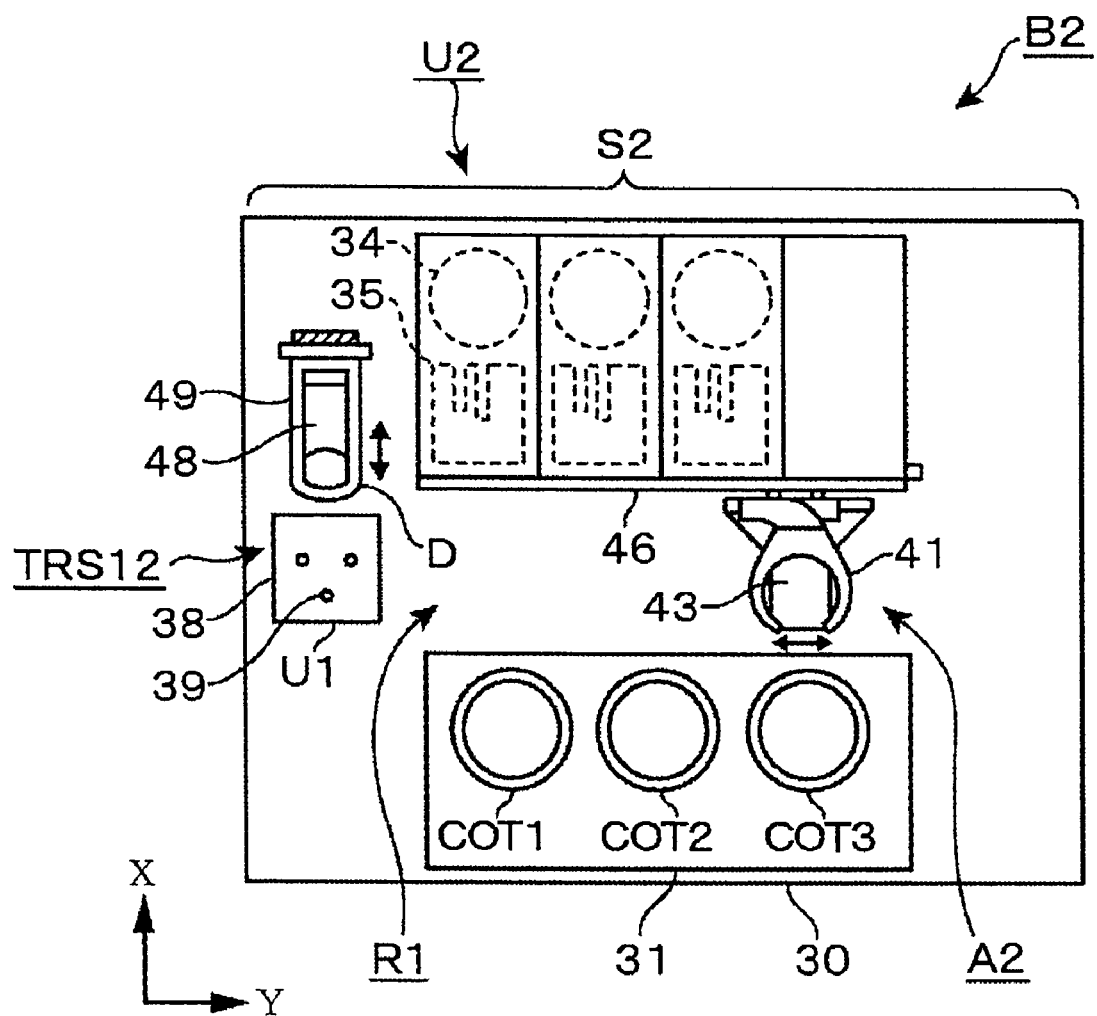
FIG. 4 is a plan view of a unit block of a COT1 layer of the coating and developing system in the first embodiment.
Figure 5:
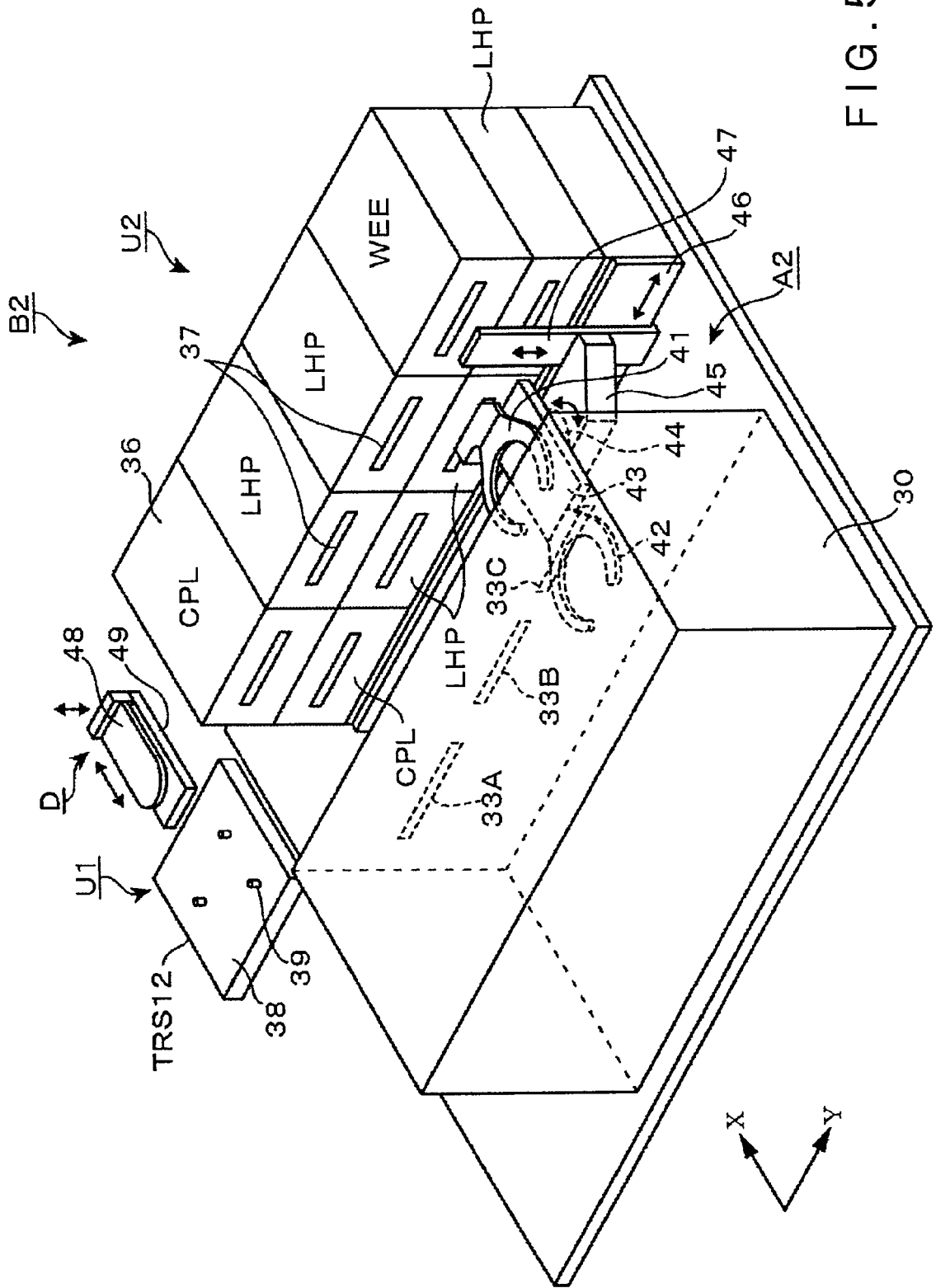
FIG. 5 is a perspective view of the unit block of the COT1 layer shown in FIG. 4.

Referring to FIGS. 4 and 5, the main arm A2 has two support arms 41 and 42 on which wafers W are seated with peripheral areas of their back surface in contact with the support arms A1 and A2, respectively. The support arms 41 and 42 can individually move forward and backward on a base plate 43. The base plate 43 is supported on a traveling base 45 so as to be turned about a vertical axis by a turning mechanism 44. Shown also in FIGS. 4 and 5 are a guide rail 46 extended along the length of the carrying area R1 parallel to the Y-direction, a vertical guide rail 47 along which the traveling base 45 moves vertically. A lower end part of the vertical guide rail 47 extends vertically down below the guide rail 46. The vertical guide rail 47 moves longitudinally parallel to the Y-direction along the guide rail 46 to move the traveling base 45 longitudinally along the carrying area R1. The vertical guide rail 47 connects to the traveling base 45 at a position separated by a distance from a position where the support arms 41 and 42 move forward and backward to avoid the vertical guide rail 47 interfering with the support arms 41 and 42.

The transfer arm D includes a vertically movable base 49, and a support arm 48, on which a wafer W is seated, mounted on the base 49 so as to be movable forward and backward. The transfer module TRS12 is provided with a plurality of support projections, for example three support projections 39 for supporting a wafer W on a transfer stage 38. The three support projections 39 are arranged so as not to interfere with the main arm A2 and the transfer arm D when they move into the transfer module TRS12.

The COT2 layer B3 is similar in construction to the COT1 layer B2. The COT2 layer B3 has a coating unit 31 provided with a plurality of coating modules, namely, wet-processing modules, for forming a resist film by coating a surface of a wafer W with a resist solution, for example, three coating modules COT21 to COT23. A shelf unit U2 includes the heating and cooling modules LHP, temperature adjusting modules CPL and edge exposure modules WEE. The shelf unit U1 has a transfer module TRS13, namely, a first transfer unit, accessible by the transfer arm D. The main arm A3 carries a wafer W to and from the coating modules COT21 to COT 23, and the modules included in the shelf units U1 and U2.

The DEV layer B1 will be described. Referring to FIGS. 1 and 3, the DEV1 layer B1 has, similarly to the COT1 layer B2, shelf units U1 and U2, and, for example, two developing modules DEV1 and DEV2, namely, wet-processing modules. The layout of the shelf units U1 and U2 and the DEV1 module and the DEV2 module of the DEV layer B1 are the same as that of the corresponding components of the COT1 layer B2. In the DEV1 layer B1, the developing modules DEV1 and DEV2, and the shelf unit U2 are arranged on the opposite sides, respectively, of a carrying area R1 extending in the Y direction. In this embodiment, the DEV1 module and the DEV2 module are stacked vertically in two layers. The two main arms A11 and A12 are installed in the carrying area R1 of the DEV layer B1. A shelf unit U3, namely, a second transfer unit, is disposed in a part of the carrying area R1 adjacent to the interface block S3. A wafer W is transferred through the shelf unit U3 between the processing block S2 and the interface block S3. The main arms A11 and A12 correspond to the sending-out carrying means and the sending-in carrying means, respectively.

The shelf unit U1 is provided with a transfer module TRS11, namely, a first transfer unit, accessible by the transfer arm D. A wafer W is transferred between the transfer module TRS11 and the carrier block S1. The transfer module TRS11 is accessible by the main arm A11 and the transfer arm D. The shelf unit U1 is provided with transfer module TRS10 accessible by a shuttle arm E and the transfer arm D.

Figure 6:
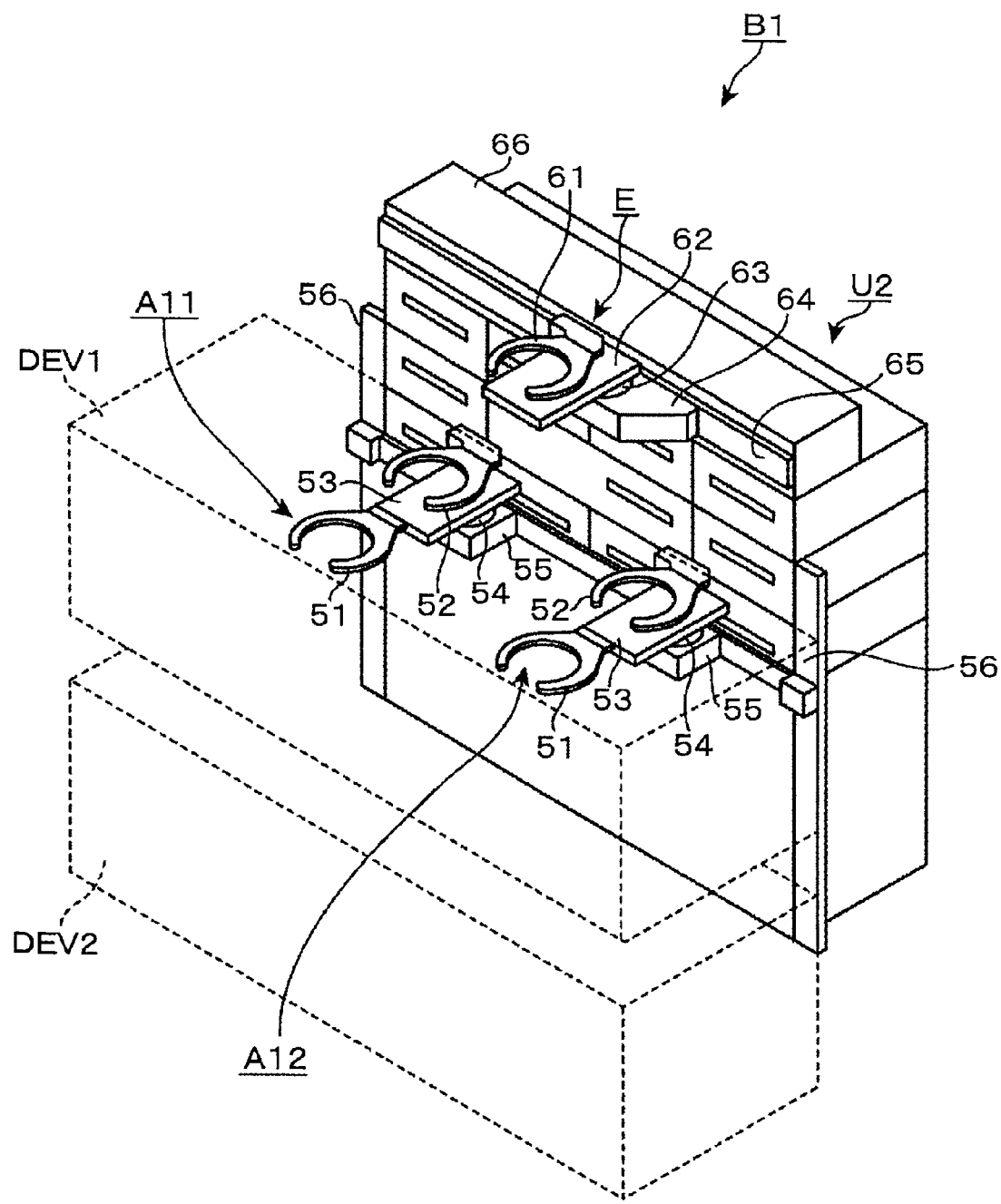
FIG. 6 is a perspective view of a unit block of a DEV layer of the coating and developing system in the first embodiment.

As shown in FIG. 6, the shelf unit U2 has processing modules arranged in three layers and four rows. The processing modules include heating modules PEB called postexposure baking modules for heating a wafer W processed by an exposure process, cooling modules COL for cooling wafer W heated by the heating module PEB to a predetermined temperature, heating modules POST called postbaking modules for heating a wafer W processed by a developing process to dry the wafer W, and temperature adjusting modules CPL for adjusting the temperature of a wafer W processed by the heating module POST to a predetermined temperature. The heating modules PEB and the cooling modules COL correspond to the preprocessing modules for processing a wafer W before the same is subjected to a developing process. The heating modules POST and the temperature adjusting modules CPL correspond to the postprocessing modules for processing a wafer W after the same has been processed by the developing process.

The shelf unit U3 is provided with transfer modules TRS20 and TRS21, namely, second transfer units. A wafer W is carried to and received from the interface block S3 through the transfer modules TRS20 and TRS21. The transfer module TRS20 is accessible by a shuttle arm E and an interface arm F. The transfer module TRS21 is accessible by the main arm A12 and the interface arm F. A11 the transfer modules of the shelf units U1 and U3 are the same in construction as the transfer module TRS12.

The main arms A11 and A12 are the same in construction and function as the main arm A2 of the COT1 layer B2, except that the main arms A11 and do not move in the Y-direction. The main arms A11 and A12 can move forward, backward and vertically and can turn about a vertical axis. As shown in FIG. 6, each of the main arms A11 and A12 has two holding arms 51 and 52, on which a wafer W is seated with a peripheral area of its back surface in contact with the holding arm, individually movable on a base 53. The base 53 is supported on a traveling base 55 so as to be turned about a vertical axis by a turning mechanism 54. The traveling base 55 is vertically movable along vertical guide rails 56. The vertical guide rails 56 are disposed so as not to interfere with the holding arms 51 and 52 when a wafer W is transferred to each of the processing modules of the shelf unit U2.

The main arm A11 carries a wafer W among the sending-out transfer unit of a developing module DEV, the transfer module TRS11 of the shelf unit U1, and six processing modules arranged in a left-hand half of the shelf unit U2, as viewed from the carrying area R1. The main arm A12 carries a wafer W among the sending-in transfer unit of the developing module DEV, the processing modules arranged in a right-hand half of the shelf unit U2, as viewed form the carrying area R1, and the transfer module TRS21. The processing modules of the shelf unit U2 accessible by the main arm A12 are, for example, heating modules PEB and cooling modules COL, namely, pretreatment modules. The processing modules of the shelf unit U2 accessible by the main arm A11 are, for example, heating modules POST and temperature adjusting modules CPL, namely, posttreatment modules.

The shuttle arm E is installed in the DEV layer. Referring to FIG. 6, the shuttle arm E has a holding arm 61 on which a wafer W is seated with a peripheral area of its back surface in contact with the holding arm 61. A base 62 is supported on a traveling base 64 so as to be turned about a vertical axis by a turning mechanism 63. The traveling base 64 is longitudinally movable along a guide rail 65 supported on a surface, facing the carrying area R1, of a support member 66 extended in an upper part of the shelf unit U2 along the length of the shelf unit U2, namely, in the Y-direction indicated in FIG. 1. The shuttle arm E carries a wafer W between the transfer module TRS10 of the shelf unit U1 and the transfer module TRS20 of the shelf unit U3.

The exposure system S4 is connected to the back end of the processing block S2 by the interface block S3. The interface arm F is installed in the interface block S3 to transfer a wafer W between the second transfer unit of the shelf unit U3 of the processing block S2 and the exposure system S4. The interface arm F is movable forward, backward and vertically and is turnable about a vertical axis.

The resist pattern forming system is provided with a controller 7 including a computer. The controller 7 controls the management of recipes for the processing modules, controls the management of recipes specifying the flow of a wafer W, namely, carrying routes, processes to be executed by the processing modules, driving operations for driving the main arms A11, A12, A2 and A3, the transfer arm C, the transfer arm D, the transfer arm E, and the interface arm F. The controller 7 is provided with a storage device for storing programs, such as computer programs. The storage device stores programs, namely, pieces of software, including a set of instructions specifying the general operations of the resist pattern forming system, namely, procedures of processes to be executed by the processing modules to form a predetermined resist pattern on a wafer W, and carrying operations for carrying a wafer W. The controller 7 reads those programs from the storage device and controls the general operations of the resist pattern forming system according to the programs. The programs are stored in a storage medium, such as a flexible disk, a hard disk, a compact disk, a magnetooptical disk or a memory card, and the storage medium is held in the storage device.

The developing module DEV will be described with reference to FIGS. 7 to 10. The developing module DEV has a processing area 100 in which a wafer W is processed by a developing process a sending-in transfer unit 111 disposed in a first end part, namely, one of opposite end parts of the processing area 100, and a sending-out transfer unit 110 disposed in a second end part, namely, the other end part, of the processing area 100. The processing area 100 extends along the length of the DEV layer B1 extending in the Y-direction indicated in FIGS. 1, and 7 to 9. As shown in FIG. 1, the sending-in transfer unit 110 is disposed in an area accessible by the main arm A12 on the side of the interface block S3. The sending-out transfer unit 111 is disposed in an area accessible by the main arm A11 on the side of the carrier block S1.

The processing area 100 has a length long enough to longitudinally arrange, for example, three wafers W along the length of the DEV layer B, and has a width, namely, a dimension in the X-direction, suitable for processing a wafer W by the developing process. A developing area 101, a cleaning area 102 and a drying area 103 are arranged in the processing area 100 in that order in a direction from the interface block S3 toward the carrier block S1. Each of the developing area 101, the cleaning area 102 and the drying area 103 has a length suitable for placing, for example, a wafer W therein.

A wafer W is carried longitudinally in the processing area 100 from a position on the side to the interface block S3 toward a position on the side of the carrier block S1 by a carrying passage forming mechanism 130. The carrying passage forming mechanism 130 is extended between a pair of rotating members 131 and 132 respectively having parallel horizontal axes of rotation. The carrying passage forming mechanism 130 turn along an orbital path. The carrying passage forming mechanism 130 forms a part of a carrying passage between the interface block S3 and the carrying block S1. More concretely, the carrying passage forming mechanism 130 includes a pair of timing belts 133 wound round the rotating members 131 and 132 so as to move along the orbital path, and a plurality of bar-shaped carrying members 120 each having opposite ends attached to the timing belts 133, respectively.

Figure 10:
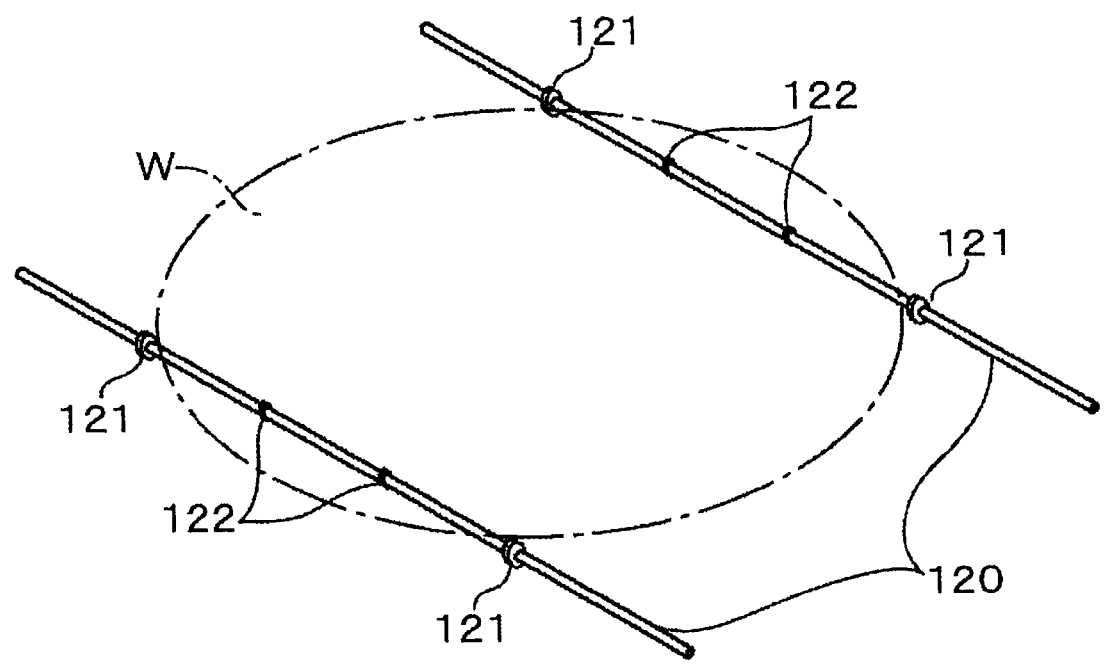
FIG. 10 is a perspective view of a carrying member included in the developing module shown in FIG. 7.

As shown in FIG. 10 by way of example, the carrying members 120 are bars of a ceramic material or a resin, such as a polytetrafluoroethylene resin, having a circular cross section or a polygonal cross section, such as a triangular cross section. The carrying members 120 have a length substantially corresponding to the width of the processing area 100. When the carrying members 120 have a circular cross section, the diameter of the carrying members 120 is on the order of 7 mm. In this embodiment, a wafer W is supported on the two carrying members 120 with peripheral parts of its back surface in contact with the carrying members 120.

The carrying members 120 are provided with guide members 121 of, for example, a polytetrafluoroethylene resin. When a wafer W is transferred from the main arm A12 to the carrying members 120, the guide members 121 adjacent to the circumference of the wafer W prevent the dislocation of the wafer W from a correct position. The carrying members 120 are provided with proximity members 122 of, for example a polytetrafluoroethylene resin to space a wafer W slightly upward from the carrying members 120; for example, a wafer W is supported at a position at 2 mm above the carrying members 120.

The pair of rotating members 131 and 132 are disposed with their axes of rotation extended along the width of the processing area 100. The rotating members 131 and 132 have a length substantially corresponding to the width of the processing area 100. The rotating member 131 is disposed at a position on the upstream side of the sending-in transfer unit 110. The rotating member 132 is disposed at a position on the downstream side of the sending-out transfer unit 111. Thus the rotating members 131 and 132 are disposed in the opposite end parts of the processing area 100, respectively. The sending-in transfer unit 110 and the sending-out transfer unit 111 are disposed at the upstream and the down stream end, respectively, of the carrying passage formed by the carrying passage forming mechanism 130.

Figure 7:
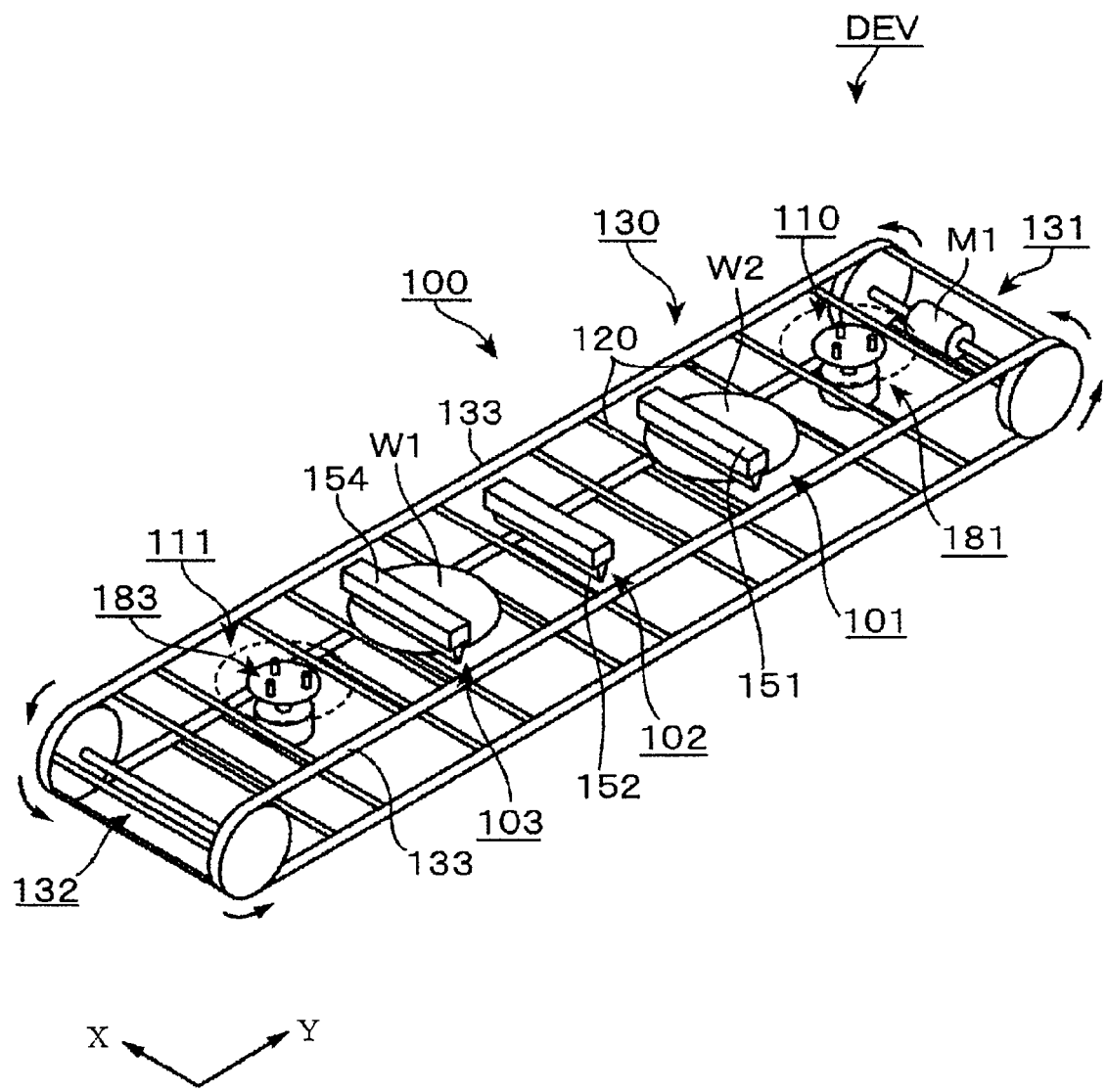
FIG. 7 is a perspective view of a developing module included in the coating and developing system in the first embodiment.
Figure 8:
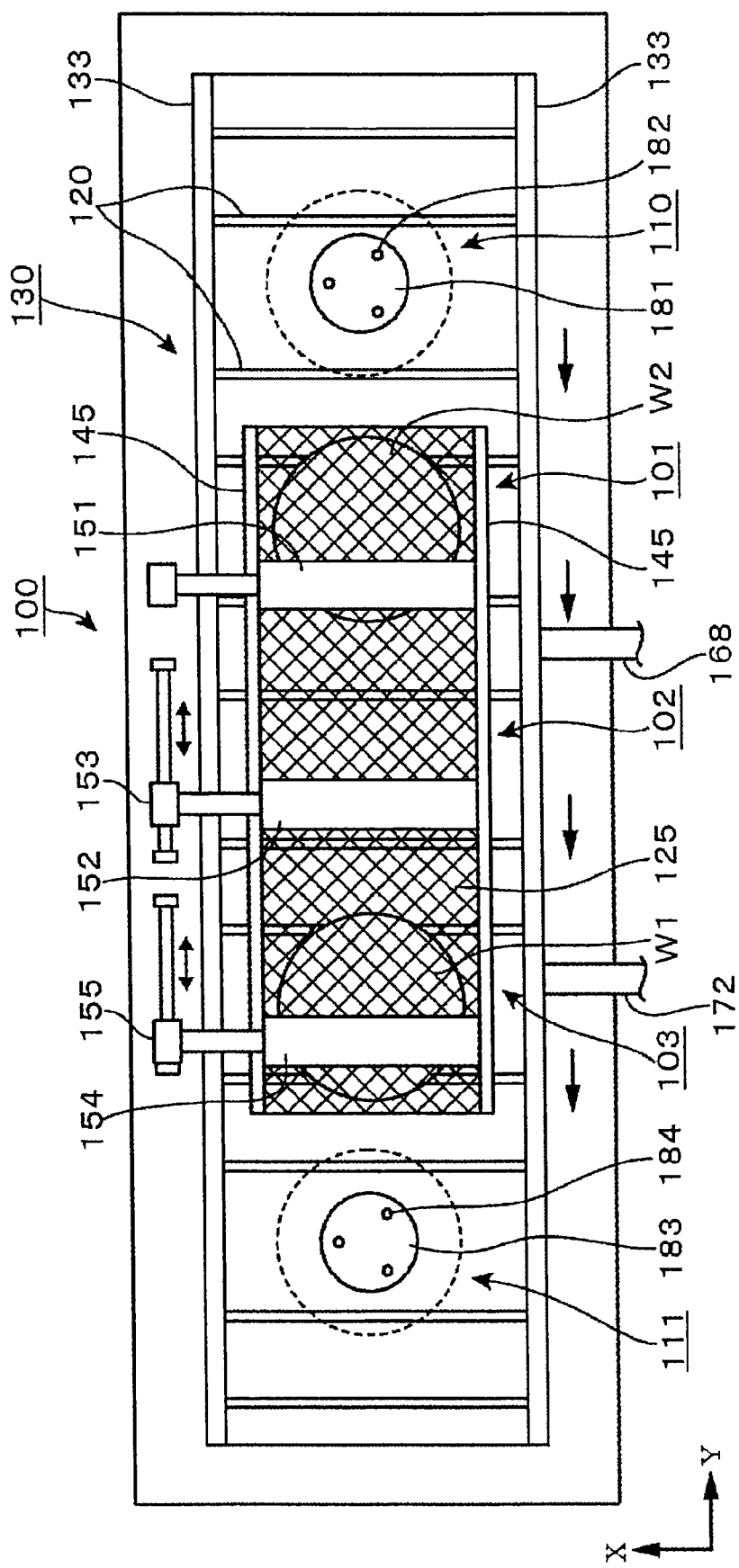
FIG. 8 is a plan view of the developing module shown in 7.

Referring to FIGS. 7 and 8, the rotating member 131 is a driving pulley driven for rotation by a motor M1, and the rotating member 132 is a driven pulley. The timing belts 133 are wound round the opposite longitudinal ends of the rotating members 131 and 132. The pairs of carrying members 120 are arranged at predetermined intervals on the timing belts 133.

The rotating members 131 and 132 are driven for rotation to move the carrying members 120 from the sending-in transfer unit 110 through the processing area 100 to the sending-out transfer unit 111, and to return the carrying members 120 to the sending-in transfer unit 110. FIG. 7 is a perspective view of assistance in explaining the carrying passage forming mechanism 130, in which a mesh belt, and members disposed inside the orbital path along which the timing belts 133 move are omitted for the sake of convenience.

Figure 11:
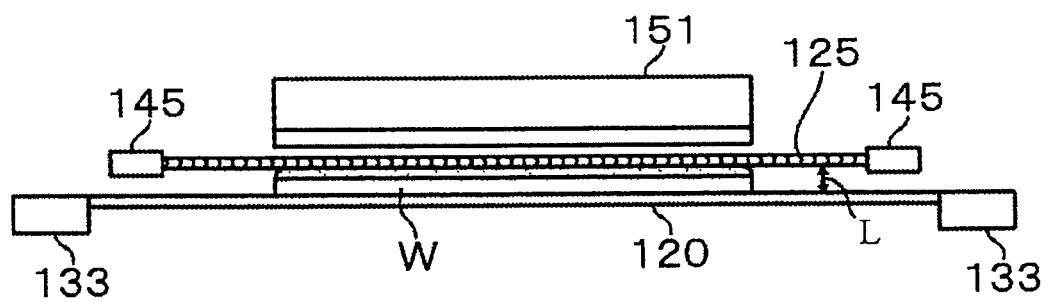
FIG. 11 is a front elevation of the carrying member of the developing module shown in FIG. 7, a wafer W and a mesh belt.

A mesh belt 125 is extended above a wafer W supported on the carrying members 120 and moving in the processing area 100. The mesh belt 125 moves along a second orbital path in synchronism with the carrying members 120. The mesh belt 125 is a mesh belt of nylon and polytetrafluoroethylene filaments having a thickness on the order of 0.15 mm and having openings of a size on the order of 1.0 mm by 1.0 mm. The mesh belt 125 has a width wide enough to cover a wafer W entirely. As shown in FIG. 11 by way of example, the mesh belt 125 is extended so as to cover the processing area 100 entirely and the distance between the lower surface of the mesh belt 125 and the surface of the carrying members 120 is, for example, on the order of 1.7 mm.

Figure 9:
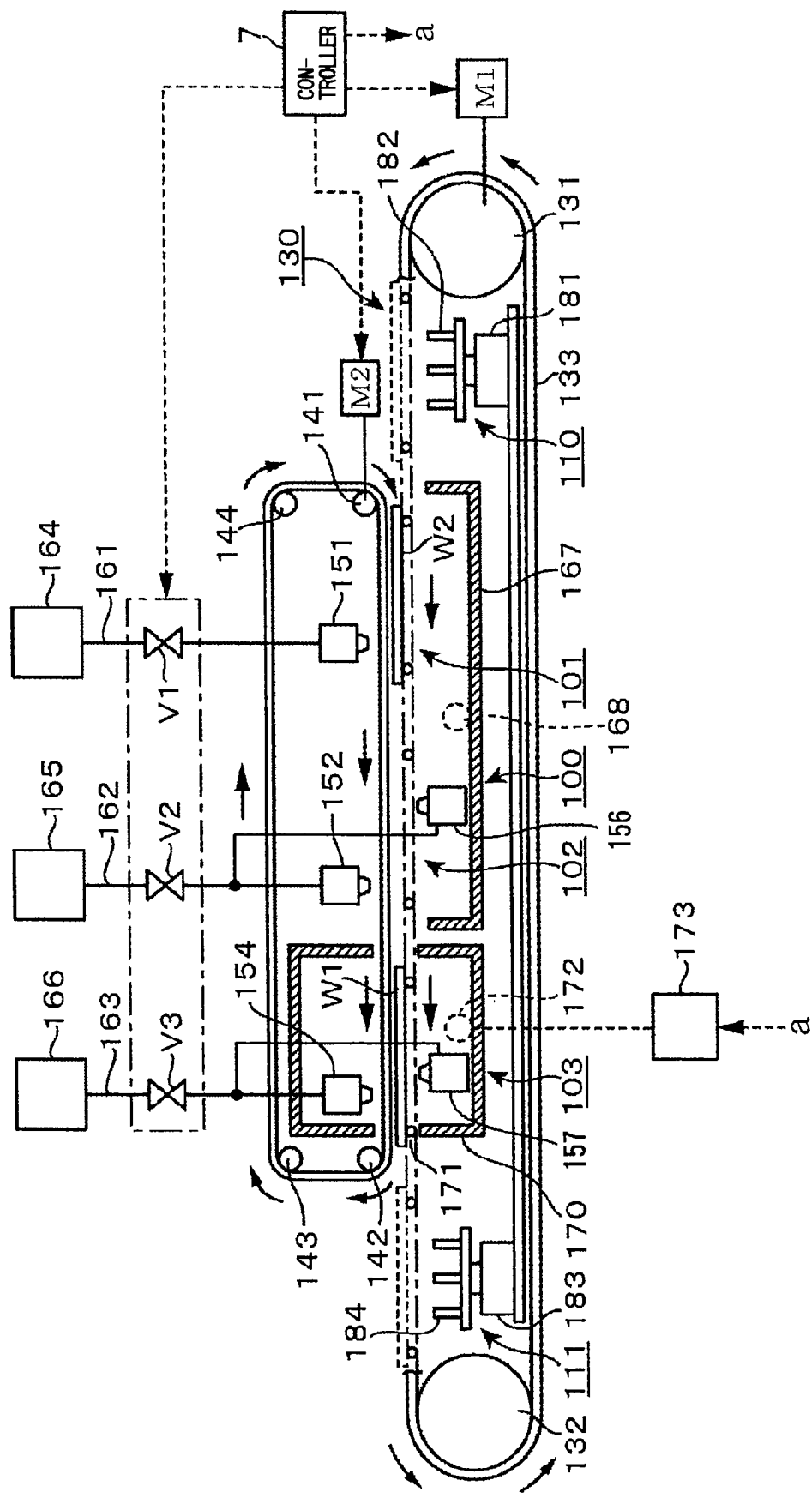
FIG. 9 is a sectional view of the developing module shown in FIG. 7.

As shown in FIG. 9, the mesh belt 125 is wound round rotating members 141, 142, 143 and 144 respectively having horizontal axes of rotation parallel to each other. The mesh belt 125 moves along a second orbital path. The axes of rotation of the rotating members 141 to 144 are parallel to the width of the processing area 100. The rotating members 141 to 144 have a length equal to the width of the mesh belt 125.

The mesh belt 125 moves without interfering with the main arm A11 in a transfer operation to transfer a wafer W to the sending-in transfer unit 110, and the main arm A12 in a transfer operation to receive a wafer W from the sending-out transfer unit 111. The rotating member 141 is disposed, for example, at a position on the upstream side of a working area where the main arm A12 transfers a wafer W to the sending-in transfer unit 110 the rotating member 142 is disposed opposite to the rotating member 141 with respect to the length of the processing area 100, for example, at a position on the upstream side of a working area where a wafer W is transferred from the sending-out transfer unit 111 to the main arm A11.

The rotating member 143 is disposed above the rotating member 142 opposite to the rotating member 142. The rotating member 144 is disposed above the rotating member 141 opposite to the rotating member 141. For example, the rotating member 141 is driving pulleys driven for rotation by a motor M2 as shown in FIG. 9, and the rotating members 142 to 144 are driven pulleys. Timing belts 145 are wound round the axially opposite ends of the rotating members 141 to 144, respectively. Although the motors M1 and M2 are separated from the rotating members 131 and 141, respectively, for the sake of convenience, actually, the motor M2, similarly to the motor M1 for driving the rotating member 131, is disposed between a pair of driving pulleys and is operatively connected to the pair of driving pulleys.

For example, side edge parts of the mesh belt 125 are attached to the pair of timing belts 145, respectively. The driving pulleys of the rotating member 141 and the driven pulleys of the rotating members 142 to 144 are toothed pulleys. The timing belts 145 are provided with openings, not shown, in which the teeth of the toothed pulleys engage. Thus the toothed pulleys and the timing belts 145 form a feed mechanism.

Operations of the motor M1 for driving the rotating member 131 of the carrying passage forming mechanism 130, and the motor M2 for driving the rotating member 141 for driving the mesh belt 125 for turning are controlled by the controller 7 such that the timing belts 133 of the carrying passage forming mechanism 130, and the timing belts 145 of the mesh belt 125 turn synchronously. Thus the mesh belt 125 moves along the second orbital path in synchronism with the carrying members 120 moving along the first orbital path; that is the mesh belt 125 and the carrying members 120 are moved simultaneously at the same moving speed, and the adjacent parts of the mesh belt 125 and the carrying members 120 move in the same direction. Therefore, a wafer W can be held so that a developer poured thereon does not drip when the wafer W is moved after pouring the developer onto the wafer W, and the flow of the developer on the wafer W can be suppressed.

A developer pouring nozzle 151 is placed in the developing area 101 to pour the developer through the mesh belt 125 onto a surface of a wafer W when the wafer W supported on the carrying members 120 moves through the developing area 101. The developer pouring nozzle 151 have a developer pouring area of a length approximately equal to or greater than the diameter of a wafer W. The developer pouring nozzle 151 is disposed such that the length of the developer pouring nozzle 151 is parallel to the width of the processing area 100 and the lower end of the developer pouring nozzle 151 is at a distance of about 2 mm from the surface of a wafer W supported on the carrying members 120.

A first cleaning nozzle 152 and a second cleaning nozzle 156 respectively for pouring a cleaning liquid, such as pure water, through the mesh belt 125 onto the upper surface of a wafer W and for pouring the cleaning liquid onto the lower surface of the wafer W when the wafer W supported on the carrying members 120 moves through the cleaning area 102 are placed in the cleaning area 102. Each of the cleaning nozzles 152 and 156 has a cleaning liquid pouring area of a length greater than the diameter of a wafer W and is disposed such that the length thereof is parallel to the width of the processing area 100. The first cleaning nozzle 152 is disposed such that the lower end of the cleaning liquid pouring nozzle 152 is at a distance of about 2 mm from the surface of a wafer W supported on the carrying members 120.

As shown in FIG. 8, the first cleaning nozzle 152, for example, can be moved in directions parallel to the length of the processing area 100 within the cleaning area 102 by a first moving mechanism 153. For example, the first cleaning nozzle 152 can be longitudinally reciprocated several times to clean the surface of a wafer W. The second cleaning nozzle 156 may be fixedly disposed at a suitable position in the cleaning area 102 or may be longitudinally movable along the length of the processing area 100 within the cleaning area 102.

A first gas nozzle 154 is placed in the drying area 103 to blow a gas serving as an air knife, such as dry air or an inert gas such as nitrogen gas, against the upper surface of a wafer W supported on the carrying members 120 and moving through the drying area 103 to dry the upper surface of the wafer W. A second gas nozzle 157 is placed in the drying area 103 to blow the gas against the lower surface of the wafer W. Each of the gas nozzles 154 and 157 has a gas blowing area of a length greater than the diameter of a wafer W and is disposed such that the length thereof is parallel to the width of the processing area 100. The first gas nozzle 154 is disposed such that the lower end of the gas nozzle 154 is at a distance of about 1 mm from the surface of a wafer W supported on the carrying members 120. As shown in FIG. 8, the first gas nozzle 154, for example, can be moved in directions parallel to the length of the processing area 100 within the drying area 103 by a second moving mechanism 155. The second gas nozzle 157 may be fixedly disposed at a suitable position in the drying area 103 or may be longitudinally movable along the length of the processing area 100 within the drying area 103.

The developer pouring nozzle 151, the first cleaning nozzle 152, the second cleaning nozzle 156, the first gas nozzle 154 and the second gas nozzle 157 are arranged, for example, in a space surrounded by the second orbital path along which the mesh belt 125 moves, and are connected so as not to obstruct the movement of the mesh belt 125 along the orbital path by supply lines 161 to 163 respectively provided with flow regulating valves V1 to V3 to a developer supply unit 164, a cleaning liquid supply unit 165 and a drying gas supply unit 166, respectively. The flow regulating valves V1 to V3 are controlled by the controller 7.

A liquid container 167 is disposed in the developing area 101 and the cleaning area 102 under the carrying members 120 to recover the developer and the cleaning liquid supplied into the developing area 101 and the cleaning area 102. In this embodiment, the liquid container 167 is placed in a space surrounded by the first orbital path along which the carrying members 120 move below the second cleaning nozzle 156. A drain line 168 is connected to the liquid container 167 so as not to obstruct the movement of the carrying members 120 along the orbital path.

The drying area 103 is surrounded by a processing vessel 170 to promote drying a wafer W. The processing vessel 170 surrounds a wafer W when the wafer W moves through the drying area 103. Slits 171 are formed in parts of the processing vessel 170 corresponding to the passage of a wafer W so that the wafer W supported on the carrying members 120 can move through the processing vessel 170. An exhaust line 172 has one end connected to the processing vessel 170 so that the exhaust line 172 may not obstruct the movement of the carrying members 120 along the orbital path, and the other end connected to an exhaust pump 173. The controller 7 controls the exhaust pump 173 to maintain the interior of the processing vessel 170 at a negative pressure. Thus the mesh belt 125 and a wafer W are simultaneously cleaned and dried.

The sending-in transfer unit 110 is provided with a first lifting pin mechanism 181 disposed, for example, inside the first orbital path along which the carrying members 120 move. The first lifting pin mechanism 181 is used for transferring a wafer W from the main arm A12 to the carrying members 120. Lifting pins 182 are vertically movable. When the main arm A12 is located at a transfer position where a wafer W is transferred from the main arm A12 to the sending-in transfer unit 110, the lifting pins 182 rise through spaces between the carrying members 120 and spaces surrounded by the holding arms 51 and 52 of the main arm A12 to a level above the holding arms 51 and 52, and move down to a level below the carrying members 120 after the wafer W has been placed on the carrying members 120.

The sending-out transfer unit 111 is the same in construction as the sending-in transfer unit 110. For example, the sending-out transfer unit 111 is provided with a second lifting pin mechanism 183 disposed inside the first orbital path along which the carrying members 120 move for transferring a wafer W from the carrying members 120 to the main arm A11. The second lifting pin mechanism 183, similarly to the first lifting pin mechanism 181, is provided with vertically movable lifting pins 184.

Figure 12A:
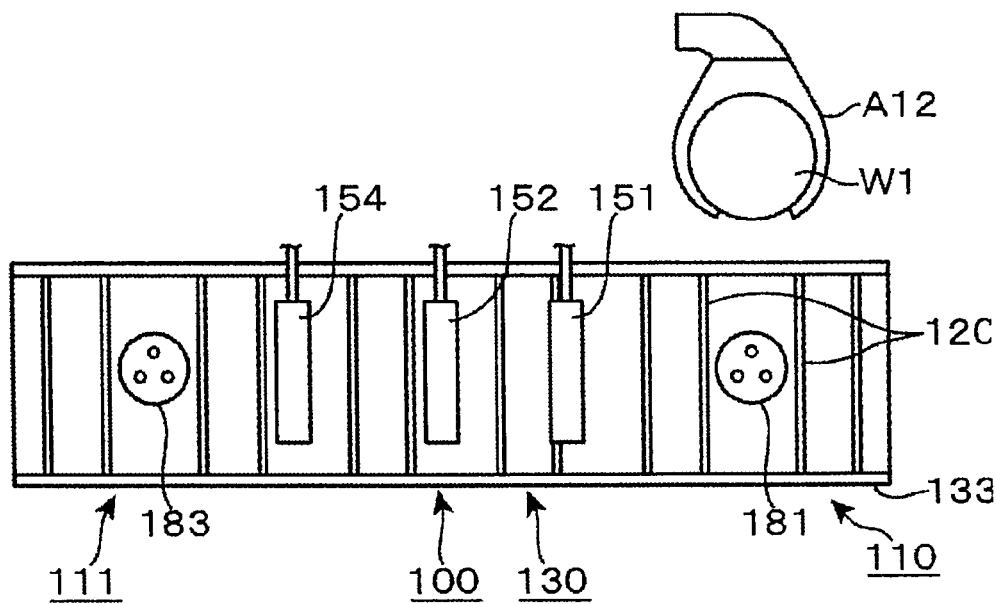
FIGS. 12A, 12B and 12C are schematic plan views of assistance in explaining operations of the developing module shown in FIG. 7.
Figure 12B:
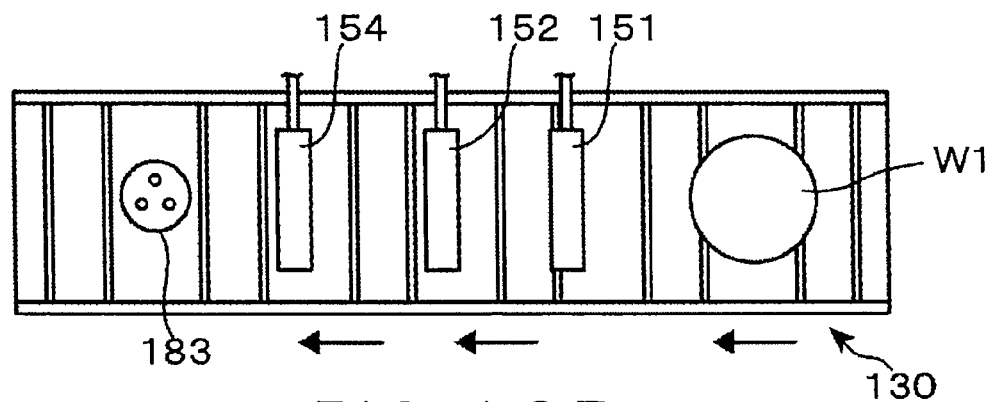

A developing process to be carried out by the developing module DEV will be described with reference to FIGS. 12 and 13. Referring to FIGS. 12A and 12B, the carrying members 120 are stopped and held stationary at a transfer position, and then a wafer W1 is transferred from the main arm A12 to the sending-in transfer unit 110. At the transfer position, the main arm A12 can place the wafer W1 at a predetermined position on the two adjacent carrying members 120, and the lifting pin mechanism 181 of the sending-in transfer unit 110 is located between the two adjacent carrying members 120.

The wafer W1 is transferred from the main arm A12 to the two carrying members 120, for example, by locating the main arm A12 above the sending-in transfer unit 110, raising the lifting pins 182 of the lifting pin mechanism 181 to a level above the carrying members 120 to transfer the wafer W1 from the main arm A12 to the lifting pins 182, and lowering the lifting pins 182 to a level below the carrying members 120 after the main arm A12 has been retracted to transfer the wafer W1 to the carrying members 120.

Figure 12C:
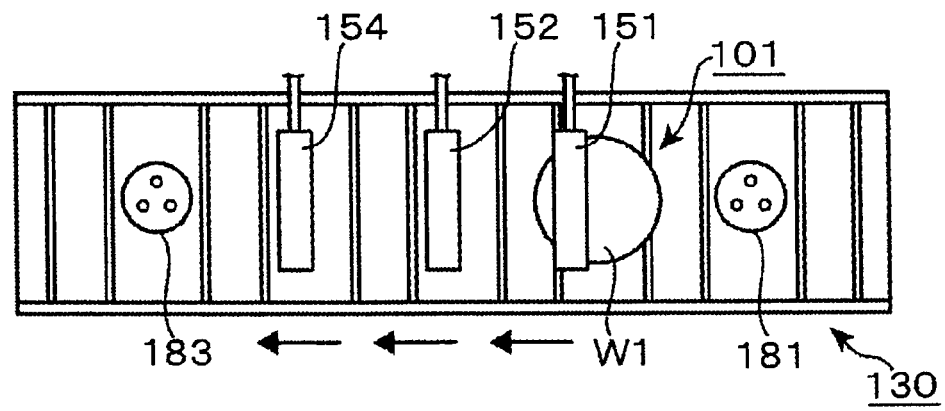

After the wafer W1 has been placed on the carrying members 120, the motors M1 and M2 are actuated to move the carrying members 120 and the mesh belt 125 from the side of the interface block S3 toward the side of the carrier block S1 at a predetermined speed. As shown in FIG. 12C, the developer is poured at a predetermined pouring rate through the developer pouring nozzle 151 onto a surface of the wafer W1 through the mesh belt 125 while the wafer W1 is being moved in the developing area 101. Although the developer pouring nozzle 151 is stationary, the developer can be poured on the entire surface of the wafer W1 because the wafer W1 moves. Thus the developing process is carried out. In FIGS. 12 and 13, the mesh belt 125, and the processing vessel 170 disposed in the drying area 103 are omitted for the sake of convenience.

Figure 13A:
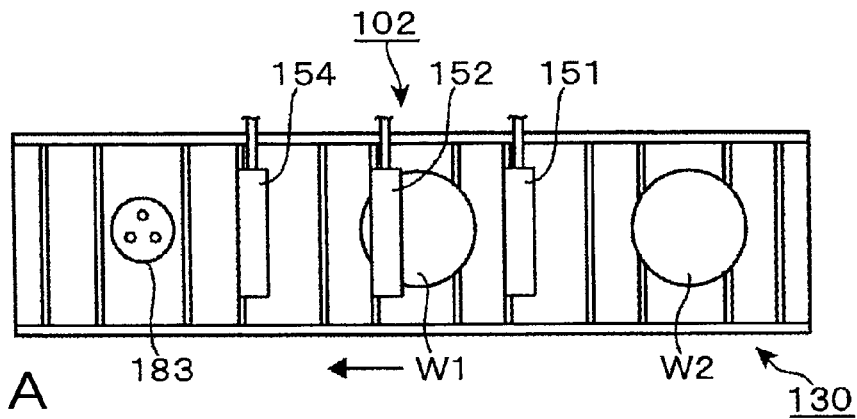
FIGS. 13A, 13B, 13C and 13D are schematic plan views of assistance in explaining operations of the developing module shown in FIG. 7.

As shown in FIG. 13A, the wafer W1 wetted with the developer is moved to the cleaning area 102. The developer covering the surface of the wafer W1 is held between the wafer W1 and the mesh belt 125 while the wafer W1 is being moved to the cleaning area 102. The length of the developing area 101 with respect to a direction in which the wafer W1 is moved may be adjusted, the moving speed of the wafer W1 may be controlled or the wafer W1 may be kept stationary for some time after wetting the surface of the wafer W1 with the developer to ensure a predetermined developing time on the order of 60 s.

After the passage of a predetermined developing time, the first cleaning nozzle 152 pours the cleaning liquid at a predetermined pouring rate through the mesh belt 125 onto the upper surface of the wafer W1 to wash the developer away from the upper surface of the wafer W1. The second cleaning nozzle 156 spouts the cleaning liquid against the lower surface of the wafer W1 to wash away the developer wetting the lower surface of the wafer W1. The first cleaning nozzle 152 pours the cleaning liquid, moving in the moving direction of the wafer W1 in the cleaning area 102. In this cleaning process, the length of the cleaning area 102 with respect to the moving direction of the wafer W1 may be adjusted, the cleaning liquid pouring rate may be adjusted or the moving speed of the wafer W1 may be controlled to ensure that the wafer W1 is perfectly cleaned. In 13, a wafer W2 is a wafer succeeding the wafer W1, and a wafer W3 is a wafer succeeding the wafer W2. Thus wafers W are successively transferred from the main arm A12 to the sending-in transfer unit 110 at predetermined intervals.

Figure 13B:
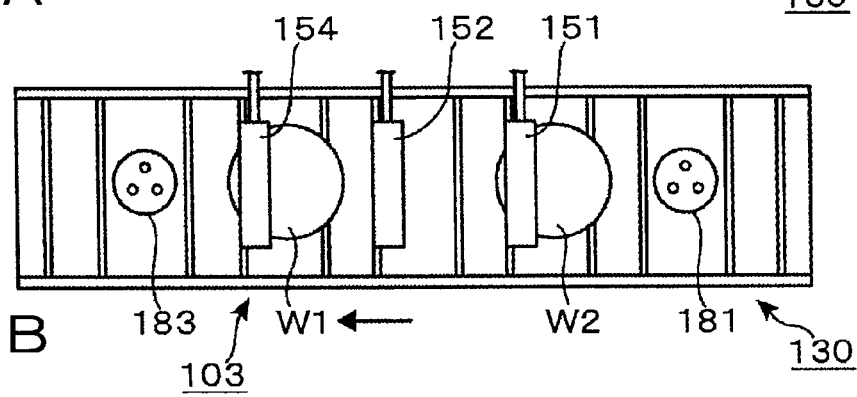

Then, the wafer W1 is moved into the drying area 103 as shown in FIG. 13B. The surfaces of the wafer W1 processed by a cleaning process is dried while the wafer W1 is moving in the processing vessel 170 evacuated at a negative pressure. The first gas nozzle 154 blows the drying gas at a predetermined rate through the mesh belt 125 against the upper surface of the wafer W1, and the second gas nozzle 157 blows the drying gas against the lower surface of the wafer W1 to dry the surfaces of the wafer W1.

The first gas nozzle 154 blows the drying gas against the upper surface of the wafer W1, moving in the processing vessel 170 in the moving direction of the wafer W1. In this drying process, the length of the drying area 103 with respect to the moving direction of the wafer W1, the pressure in the processing vessel 170 may be adjusted, a desired number of gas nozzles like the gas nozzle 154 may be used or the moving speed of the gas nozzle 154 may be controlled to ensure that the surfaces of the wafer W1 are perfectly dried.

Figure 13C:
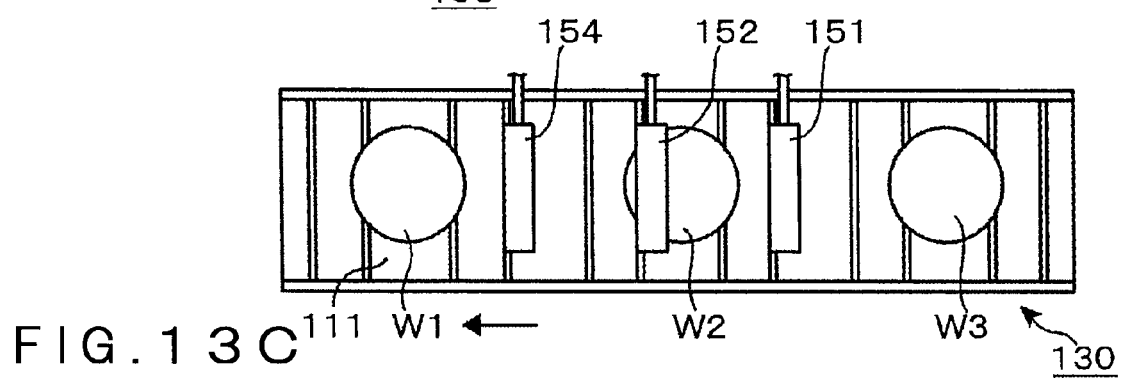
Figure 13D:
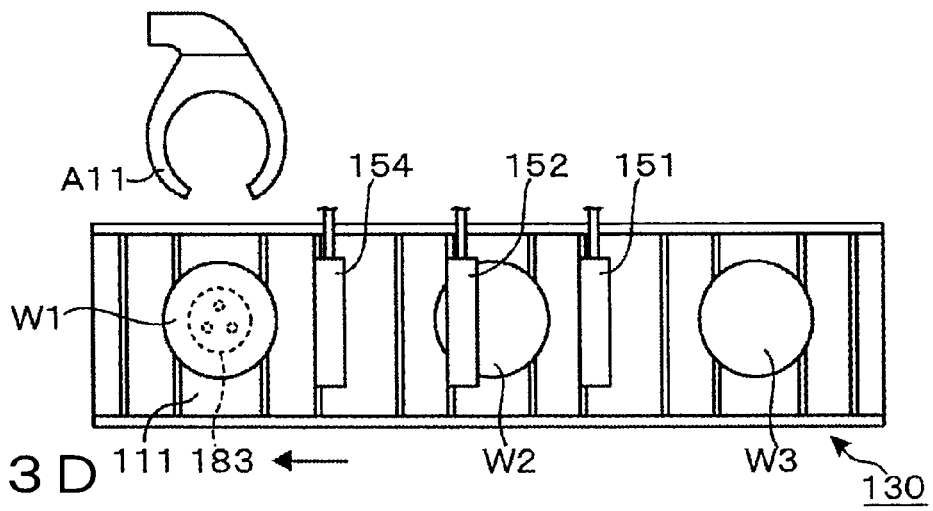

Then, the wafer W1 is moved to the sending-out transfer unit 111 as shown in FIG. 13C and is transferred to the main arm A11. The carrying members 120 are moved to and located at a transfer position, where the lifting pin mechanism 183 of the sending-out transfer unit 111 is between the two adjacent carrying members 120 as shown in FIG. 13D.

For example, the lifting pins 184 of the lifting pin mechanism 183 are raised from below the carrying members 120 supporting the wafer W1 thereon to transfer the wafer W1 from the carrying members 120 to the lifting pins 184, the main arm A11 is advanced into a space between the carrying members 120 and the lifting pins 184, the main arm A11 is raised to transfer the wafer W1 from the lifting pins 184 to the main arm A11, the main arm A11 supporting the wafer W1 is retracted, and then the lifting pins 184 are lowered to a level below the carrying members 120.

Thus wafers W not yet processed by the developing process are transferred successively from the main arm A12 to the sending-in transfer unit 110 at predetermined intervals in the developing module DEV. The developer is poured on to the surface of the wafer W in the developing area 101, the developer is washed away from the surface of the wafer W in the cleaning area 102, and the surfaces of the wafer W is dried in the drying area 103 while the wafer W thus transferred to the sending-in transfer unit 110 moves from the upstream end toward the down stream end of the processing area 100. The wafer W thus processed is transferred to the sending-out transfer unit 111. The wafers W processed by the developing process are delivered successively to the sending-out transfer unit 111 at predetermined intervals, and then, the wafers W processed by the developing process are transferred from the sending-out transfer unit 111 to the main arm A11 at predetermined intervals. After the wafer W has been transferred to the main arm A11, the carrying members 120 are returned to the sending-in transfer unit 110.

Carrying routes along which a wafer W is carried in the resist pattern forming system will be described. The controller 7 controls the main arms A11, A12, A2 and A3, the transfer arm C, the transfer arm D, the shuttle arm E and the interface arm F on the basis of a recipe specifying a carrying flow (carrying routes) to carry a wafer along the carrying routes.

A transfer arm C takes out a wafer W from a carrier 20 delivered to the carrier block S1 from an external device, and then transfers the wafer W to the transfer module TRS11 of the shelf unit U1. Then, the transfer arm D carries the wafer W from the transfer module TRS11 to the transfer module TRS12 (TRS13). The main arm A2 (A3) of the COT1 layer B2 (the COT2 layer B3) receives the wafer W from the transfer module TRS12 (the transfer module TRS13). In the COT1 layer B2 (the COT2 layer B3), the main arm A2 (A3) carries the wafer W along a route successively passing the temperature adjusting module CPL, the coating module COT, the heating module LHP and the edge exposure module WEE to form a resist film on the wafer W.

The main arm A2 (A3) transfers the wafer W coated with the resist film from the COT1 layer B2 (the COT2 layer B3) to the transfer module TRS12 (TRS13). Then, the transfer arm D carries the wafer W to the transfer module TRS10. Subsequently, the shuttle arm E carries the wafer W in the DEV layer B1 to the transfer module TRS20 of the shelf unit U3. Then, the interface arm F transfers the wafer W from the transfer module TRS20 to the exposure system S4. The exposure system S4 processes the wafer W by a predetermined exposure process.

A carrying route along which the wafer W processed by the exposure process is carried will be described. The interface arm F carries the wafer W processed by the exposure process to the transfer module TRS21 of the shelf unit U3. The main arm A22 of the DEV layer B1 carries the wafer W from the transfer module TRS21 into the DEV layer B1. Subsequently, the main arm A12 carries the wafer W along a route successively passing the heating module PEB, the cooling module COL, and the sending-in transfer unit 110 of the developing module DEV to subject the wafer W to the developing process by the developing module DEV.

The wafer W processed by the developing process is transferred through the sending-out transfer unit 111 of the developing module DEV to the main arm A11. The main arm 11 carries the wafer W along a route successively passing the heating module POST, the temperature adjusting module CPL, and the transfer module TRS11 of the shelf unit U1 to subject the wafer W to all the necessary processes. The transfer arm C returns the wafer W thus processed from the transfer module TRS11 to the carrier 20 held in the carrier block S1.

The DEV layer B1 provided with the developing module DEV of the above-mentioned construction can improve the throughput of the resist pattern forming system. In the DEV module, the main arm A12 delivers wafers W successively at the predetermined intervals to the sending-in transfer unit 110, the wafers W are subjected successively to the developing process, the cleaning process and the drying process while the wafers W are carried successively downstream through the processing area 100, and the wafers W are transferred successively from the sending-out transfer unit 111 to the main arm A11.

The size of the developing module DEV is designed such that three wafers W can be arranged in the moving direction in the processing area 100, and hence the size of the developing module DEV is approximately equal to the size of a developing unit formed by laterally arranging three conventional developing modules. Times needed for completing the developing process, the cleaning process and the drying process by the developing module DEV are equal to those needed by the developing unit including the three laterally arranged conventional developing modules, and the time needed for completing the developing process is rate controlling time. Therefore, the developing module DEV of the present invention can process wafers W at a throughput higher than the total throughput of the three conventional developing modules, when wafers W are carried through the sending-in transfer unit 110 into the developing module DEV at intervals corresponding to the time needed to complete the developing process.

The developing module DEV of the present invention can achieve such a high throughput because the developing module DEV processes wafers W while the wafers W are moving, and the wafers W are continuously subjected to the developing process by sending wafers W successively into the developing module DEV through the sending-in transfer unit 110 at the predetermined intervals. When the three conventional developing modules are used, a main arm needs to carry out operations for carrying a processed wafer W out from each of the three processing modules and for carrying a wafer W to be processed into each of the three developing modules. Since the developing process cannot be executed during those operations, which reduces the throughput.

The main arm carries a wafer W to and receives the wafer W from each conventional developing module. Therefore, the main arm needs to access three points when the three conventional developing modules are arranged. On the other hand, the developing module DEV of the present invention has the sending-in transfer unit 110 and the sending-out transfer unit 111, and hence the main arms A11 and A12 need to access two points. Therefore, loads on the main arms A11 and A12 are small, which improves the throughput.

Since the main arms A11 and A12 operate individually to carry out a wafer W from the developing module DEV and to carry a wafer W into the developing module DEV, respectively, loads on the main arms A11 and A12 are small. The main arms A11 and A12 do not need to move in the direction along the length of the carrying area R1, namely, the Y-direction, the carrying time is reduced by a time needed to move in the Y-direction. The main arm A12 operates exclusively for carrying in a wafer W, and the main arm A11 operates exclusively for carrying out a wafer W. Thus the number of steps of work of the main arm A12 is smaller than that needed when the main arm A12 needs to carry a processed wafer W out from the developing module and to carry a wafer to be processed into the developing module.

Even if two main arms are used for the conventional developing modules to transfer a wafer W, the number of steps of work to be carried out by the two main arms is larger than that to be carried out by the main arms A11 and A12 in the developing module DEV of the present invention because the conventional developing modules have many points to be accessed by the main arms, and a wafer W needs to be carried into the developing module after carrying out a processed wafer W from the developing module. Thus the load on the conventional main arm is greater than that on the main arm of the present invention.

According to the present invention, the moving direction of a wafer W in the developing module DEV is the same as a direction in which the length of the carrying area R1 of the DEV layer B1 extends. Therefore, the developing module DEV can be properly disposed in the DEV layer B1 without enlarging the DEV layer B1 even if the length of the developing module DEV is increased. The main arm A12 is disposed on the side of the interface block S3, the main arm A11 is disposed on the side of the carrier block S1, the pretreatment modules for processing a wafer W before the wafer W is processed by the developing process are disposed in parts of the shelf unit U2 accessible by the main arm A12, and the posttreatment modules for processing a wafer W processed by the exposure process are disposed in parts of the shelf unit U2 accessible by the main arm A11. Therefore, a wafer W processed by the exposure process and carried through the interface block S3 into the DEV layer B1 is carried along the predetermined route by the main arm A12, and then the wafer W is carried along the predetermined route by the main arm A11. Thus the wafer W can be smoothly carried from the interface block S3 to the carrier block S1. Consequently, the carrying time can be further reduced, and the improvement of the throughput can be expected.

The developing module DEV is provided with the mesh belt 125, the developer is held between a wafer W and the mesh belt 125 while the wafer W moves. The wafer W and the mesh belt 125 move synchronously at the same moving speed. Consequently, the flow of the developer on the wafer W can be suppressed by the mesh belt 125, the partial collection of the developer in a part of the surface of the wafer W and the dripping of the developer from the wafer W can be suppressed even if the wafer W is moved, the surface of the wafer W can be uniformly processed by the developing process.

Figure 14:
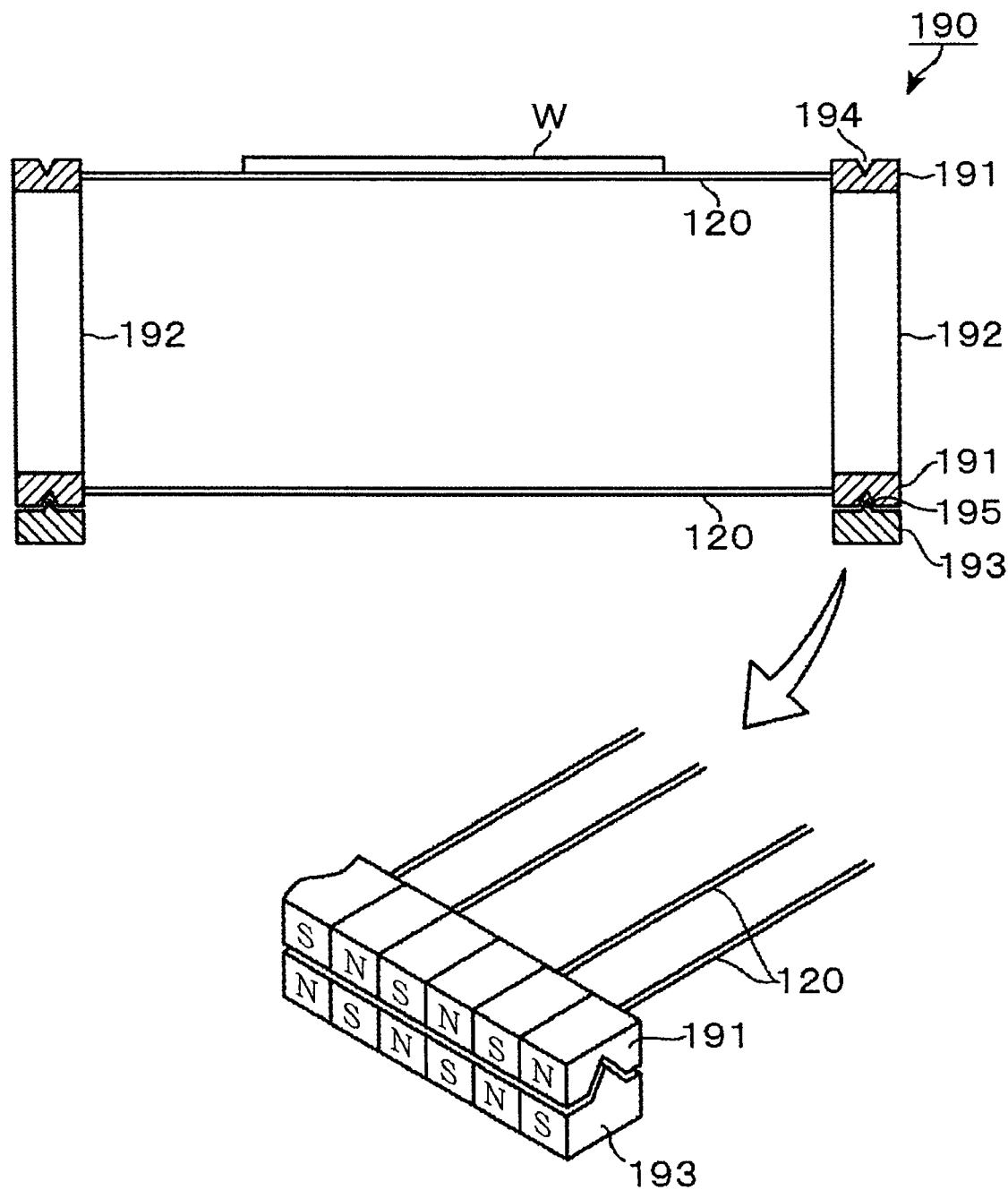
FIG. 14 is a sectional view and a perspective view of a developing module in a modification.

A resist film forming system in a second embodiment according to the present invention will be described with reference to FIG. 14. The second embodiment differs from the first embodiment in that timing belts 191 holding carrying members 120 are moved by linear motors along first orbital paths, respectively. The second embodiment is provided with first pulleys instead of the drive pulleys of the rotating member 131, second pulleys, not shown, instead of the driven pulleys of the rotating member 132. The timing belts 191 are extended between the first pulleys 192 and the second pulleys. The sizes and positions of the first pulleys 192 and the second pulleys are equal to those of the rotating members 131 and 132 of the carrying passage forming mechanism 130.

The timing belts 191 are provided at least on the outer surfaces thereof with electromagnets arranged such that N poles and S poles are arranged alternately. Driving electromagnets 193 for driving the timing belts 191 are arranged in parts, such as lower straight parts, of the first orbital paths of the timing belts 191. The driving electromagnets 193 are slightly spaced apart from the timing belts 191 when the timing belts 191 are moved. The polarities of the driving electromagnets 193 are changed such that N poles and S poles are arranged alternately. The controller 7 controls switching the polarities.

V-shaped grooves 194 are formed in the surfaces of the timing belt 191 facing the driving electromagnets 193, respectively. V-shaped projections 195 conforming to the V-shaped grooves 194 of the timing belts 191 are formed in the surfaces of the driving electromagnets 193 facing the timing belts 191, respectively.

The driving electromagnets 193 are energized, and the polarities of the driving electromagnets 193 are switched to float the timing belts 191 slightly above the driving electromagnets 193, and the first and the second pulleys are rotated to move the timing belts 191 respectively along the first orbital paths.

Figure 15:
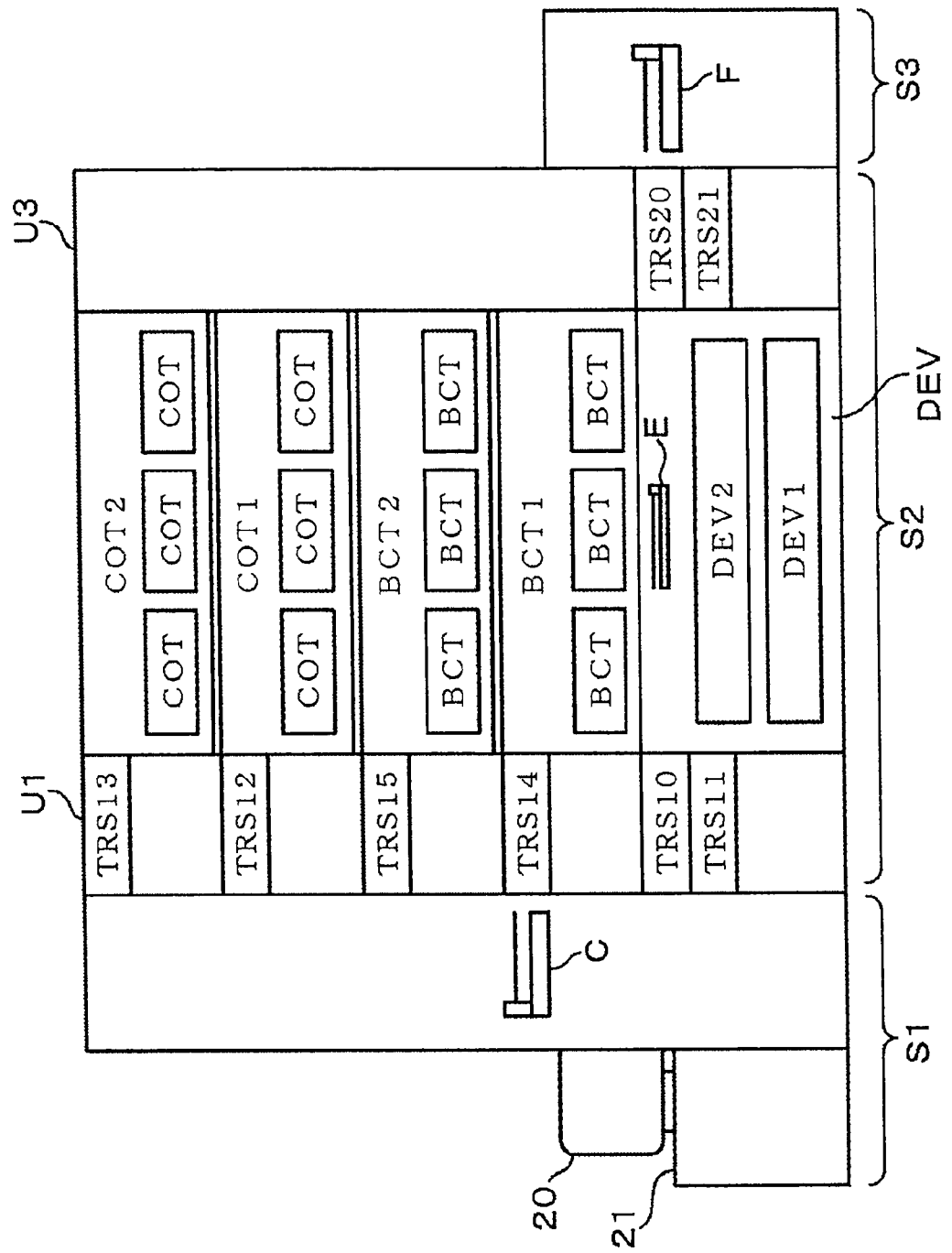
FIG. 15 is a side elevation of a coating and developing system in a second embodiment according to the present invention.

A resist film forming system in a second embodiment according to the present invention will be described with reference to FIG. 15. The resist film forming system in the third embodiment differs from the resist film forming system in the first embodiment in that a processing block S2 is built by stacking a DEV1 layer, two BCT layers, namely, a BCT1 layer and a BCT2 layer, and two COT layers, namely, a COT1 layer and a COT2 layer, upward in that order. The BCT1 layer and the BCT2 layer are first antireflection film forming layers for forming an antireflection film (hereinafter, referred to "first antireflection film") under a resist film, and correspond to film forming unit blocks.

The BCT1 layer and the BCT2 layer are substantially similar in construction to the COT1 layer (COT2 layer) of the first embodiment. The BCT1 layer has, for example, three first antireflection film forming modules BCT, namely, wet-processing modules, for forming a first antireflection film on a wafer W. A shelf unit U2 has heating and cooling modules LHP and temperature adjusting modules CPL. A shelf unit U1 has a transfer module TRS14 through which a wafer W is transferred, for example, between a transfer arm C and a transfer arm D. A main arm A4, not shown, carries a wafer W to and from those modules.

The BCT2 layer has, for example, three first antireflection film forming modules BCT, namely, wet-processing modules, for forming a first antireflection film on a wafer W. The shelf unit U2 has heating and cooling modules LHP and temperature adjusting modules CPL. The shelf unit U1 has a transfer module TRS15 through which a wafer W is transferred, for example, between the transfer arm C and the transfer arm D. A main arm A5, not shown, carries a wafer W to and from those modules. The DEV layer, the COT1 layer and the COT2 layer are similar in construction to those of the first embodiment.

A carrying route along which a wafer W is carried in this resist pattern forming system to form a resist film on a first antireflection film will be described by way of example. The transfer arm C transfers a wafer W from the carrier block S1 to the transfer module TRS14 or TRS15 of the shelf unit U1. The main arm A4 of the BCT1 layer receives the wafer W from the transfer module TRS14 and carries the wafer W along a route successively passing the temperature adjusting unit CPL, the antireflection film forming module BCT, and the heating and cooling module LHP to the transfer module TRS14 to form an antireflection film on a surface of the wafer W. The main arm A5 of the BCT2 layer receives the wafer W from the transfer module TRS15 and carries the wafer W along a route similar to the route in the BCT1 layer to the transfer module TRS15.

The transfer arm D transfers the wafer W from the transfer module TRS14 (TRS15) to the transfer module TRS12 (TRS13). A main arm A2 included in the COT1 layer receives the wafer W from the transfer module TRS12 and carries the wafer W along the above-mentioned route to the transfer module TRS12 to form a resist film on the antireflection film. A main arm A3 receives the wafer W from the transfer module TRS13 and carries the wafer W in the COT2 layer along a route similar to that in the COT1 layer to the transfer module TRS13.

The transfer arm D carries the wafer W from the transfer module TRS12 (TRS13) to a transfer module TRS10. A shuttle arm E carries the wafer W from the transfer module TRS10 to a transfer module TRS20. Then, an interface arm F carries the wafer W into an exposure system S4 to subject the wafer W to a predetermined exposure process. The wafer W processed by the exposure process is carried and processed like the wafer W is carried and processed by the first embodiment.

The processing block S2 may be provided with a BCT1 layer and a BCT2 layer. When the processing block S2 is provided with the BCT1 layer and the BCT2 layer, the resist pattern forming system can achieve a high throughput because wafers W are carried efficiently in the DEV layer.

Figure 16:
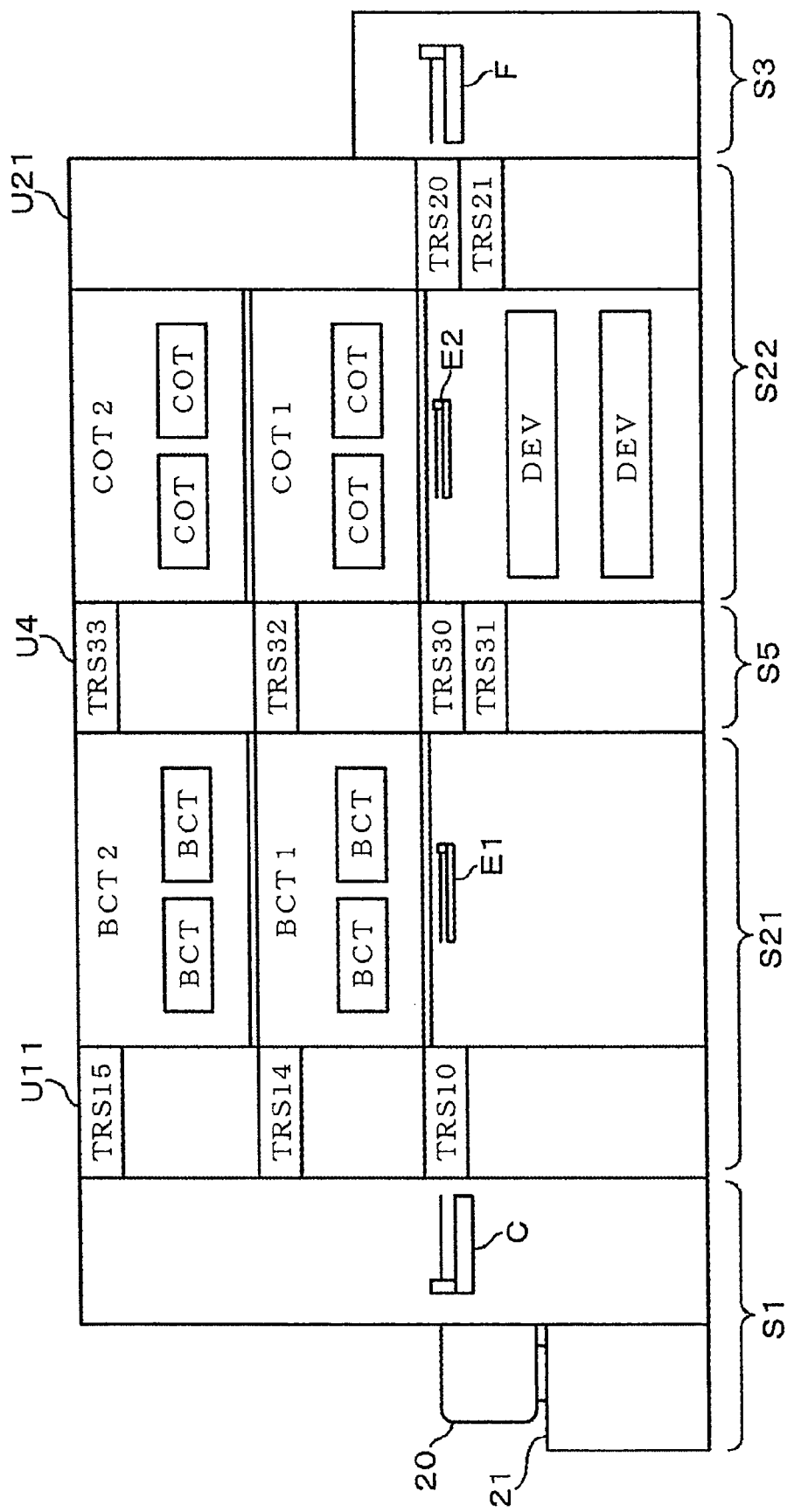
FIG. 16 is a side elevation of a coating and developing system in a third embodiment according to the present invention.
Figure 17:
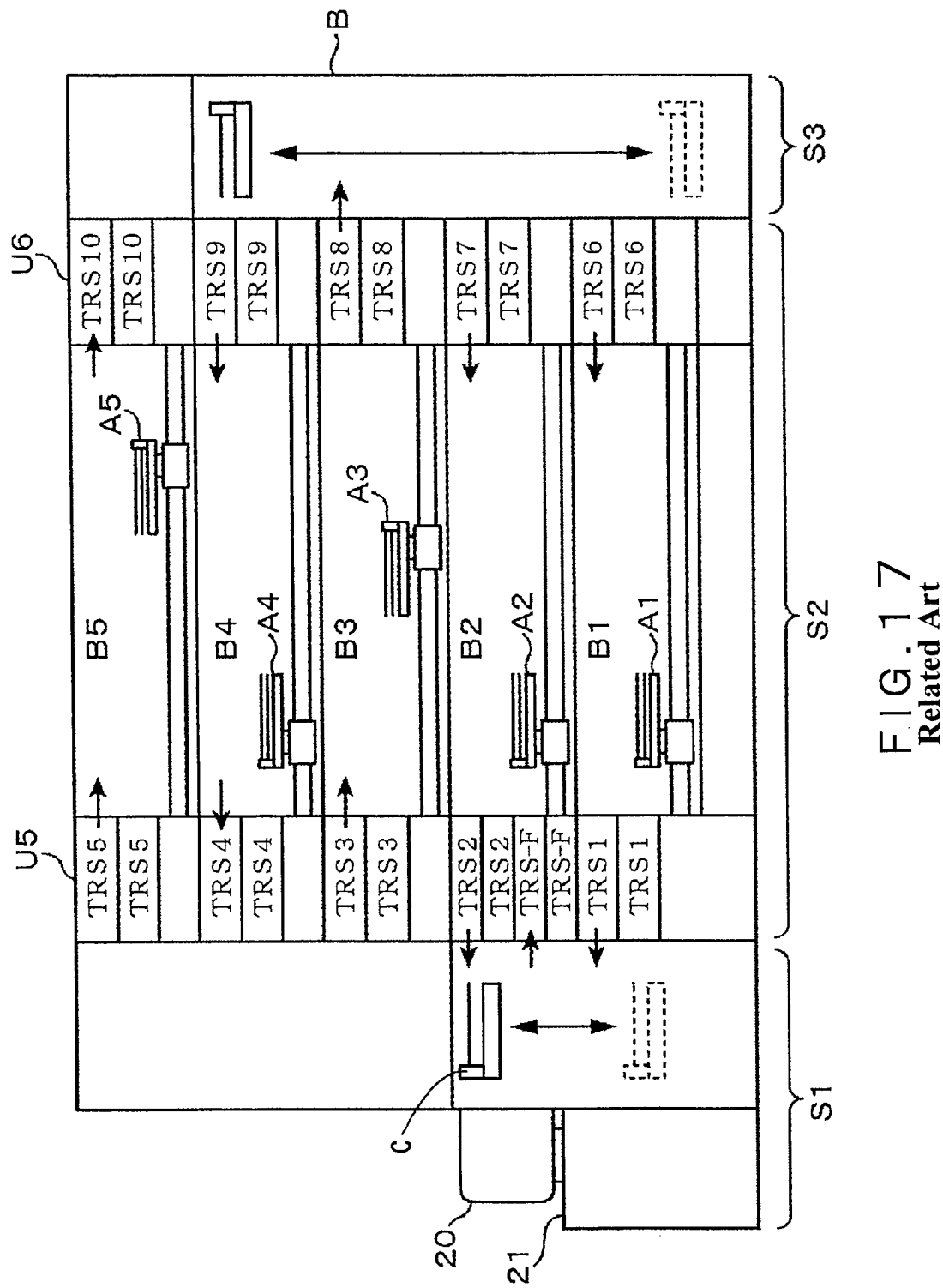
FIG. 17 is a side elevation of a known coating and developing system.

A resist pattern forming system in a third embodiment according to the present invention will be described with reference to FIG. 16. This resist pattern forming system differs from the resist pattern forming system in the first embodiment in that this resist pattern forming system has a processing block S2 including a first processing block S21 and a second processing block S22, and a transfer block S5 is interposed between the first processing block S21 and the second processing block S22.

The first processing block S21 is adjacent to a carrier block S1 and includes two BCT layers, namely, a BCT1 layer and a BCT2 layer. The first processing block S21 is similar in construction to the above-mentioned processing block S2. In the first processing block S21, a shelf unit U11, namely, a first transfer unit, is installed in an area adjacent to the carrier block S1. In this embodiment, the shelf unit U11 has a transfer module TRS14 corresponding to the BCT1 layer, a transfer module TRS15 corresponding to the BCT2 layer, and a transfer module TRS10 at a position, for example, below the BCT1 layer. The transfer modules TRS10, TRS14 and TRS15 are accessible by a transfer arm D1, not shown. A transfer arm C and a shuttle arm E1 carry a wafer W to and receive a wafer W from the transfer module TRS10. The shuttle arm E1 is disposed under the BCT1 layer. Each of the BCT1 layer and the BCT2 layer is provided with two antireflection film forming modules BCT. The transfer modules TRS10, TRS14 and TRS15, the shuttle arm E1, the transfer arm D1, the antireflection film forming modules BCT, and processing modules included in a shelf unit U2 are the same in construction as those of the first embodiment.

The second processing block S22 is built by stacking a DEV layer, and two COT layers, namely, a COT1 layer and a COT2 layer upward in that order. The COT1 layer and the COT2 layer, and the BCT1 layer and the BCT2 layer are on the opposite sides, respectively, of the transfer block S5. A shelf unit U21, namely, a second transfer unit, is disposed in an area adjacent to a interface block S3. In this embodiment, the shelf unit U21 has transfer modules TRS20 and TRS21 corresponding to the DEV layer. The transfer module TRS20 is exclusively for a shuttle arm E2. The transfer modules TRS20 and TRS21 are accessible by an interface arm F. The DEV layer is the same in construction as that of the first embodiment, except that the shelf unit U21 and a transfer arm D1, not shown, are disposed in an area adjacent to the interface block S3. The COT1 layer and the COT2 layer are similar in construction to those of the first embodiment, except that each of the COT1 layer and the COT2 layer is provided with two coating modules COT, and the shelf unit U21 is adjacent to the interface block S3.

The transfer block S5 includes a shelf unit U4 through which a wafer W is transferred to, for example, the unit blocks of the first processing block S21 and the second processing block S22. The shelf unit U4 has a transfer module TRS30 and a transfer module TRS31 corresponding to the DEV layer, a transfer module TRS32 corresponding to the BCT1 layer and the COT1 layer, and a transfer module TRS33 corresponding to the BCT2 layer and the COT2 layer. The transfer block S5 is provided with a transfer arm G, not shown, for carrying a wafer W to and receiving a wafer W from the transfer modules of the shelf unit U4. The transfer arm G is movable forward and backward and is vertically movable. The transfer modules of the shelf unit U4 are accessible by main arms included in unit blocks of the first processing block S21 and the second processing block S22, respectively.

A carrying route along which a wafer W is carried in this resist pattern forming system to form a resist film on a first antireflection film will be described by way of example. The transfer arm C transfers a wafer W from the carrier block S1 to the transfer module TRS10 of the shelf unit U1. Then, the transfer arm D1 carries the wafer W to the transfer module TRS14 or TRS15. The main arm A4 of the BCT1 layer receives the wafer W from the transfer module TRS14, carries the wafer W along a route like that mentioned above passing predetermined modules of the BCT1 layer, and carries the wafer W to the transfer module TRS14. The main arm A5 of the BCT2 layer receives the wafer W from the transfer module TRS15, carries the wafer W along a route like that mentioned above, and carries the wafer W to the transfer module TRS15.

Subsequently the transfer arm D1 receives the wafer W from the transfer module TRS14 (TRS15) and carries the wafer W to the transfer module TRS10. Then, the shuttle arm E1 carries the wafer W from the transfer module TRS10 to the transfer module TRS30 of the transfer block S5. Subsequently, the transfer arm G carries the wafer W from the transfer module TRS30 to the transfer module TRS32 or TRS33. The main arm A2 of the COT1 layer receives the wafer W from the transfer module TRS32 and carries the wafer W along the above-mentioned route in the COT1 layer to the transfer module TRS32. The main arm A3 of the COT2 layer receives the wafer W from the transfer module TRS33 and carries the wafer W along a route similar to that in the COT1 layer in the COT2 layer to the transfer module TRS33.

The transfer arm G carries the wafer W from the transfer module TRS32 (TRS33) to the transfer module TRS30. Then, the shuttle arm E2 carries the wafer W to the transfer module TRS20. Then, the interface arm F transfers the wafer W to the exposure system S4 to subject the wafer W to a predetermined exposure process. The wafer W processed by the exposure process is carried along a route successively passing the interface arm F, the transfer module TRS21 of the shelf unit U21, and the main arm A1 of the DEV layer to the DEV layer. The wafer W is carried along a route similar to that in the foregoing embodiment in the DEV layer. Then, the wafer W is carried along a route successively passing the transfer module TRS31 of the transfer block S5, and the transfer arm G to the transfer module TRS30. Then, the shuttle arm E1 carries the wafer W to the transfer module TRS10 of the shelf unit U11, and then the transfer arm C returns the wafer W into the carrier 20, from which the wafer W was taken out, placed in the carrier block S1.

The processing block S2 may include the first processing block S21, a second processing block S22, and the transfer block S5 interposed between the first processing block S21 and the second processing block S22. When the processing block S2 is thus built, the resist pattern forming system can achieve a high throughput because the wafer W is carried efficiently in the DEV layer.

Three developing modules DEV may be stacked up in three layers in the DEV layer. As regards the construction of the developing module DEV, the size of the processing area 100 is not limited to the above-mentioned size, and the mesh belt 125 and the processing vessels 170 are not necessarily indispensable, provided that the carrying passage forming mechanism 130 forming the carrying passage along which a wafer W is carried moves along the orbital path, the sending-in transfer unit 110 is disposed at the upstream end of the carrying passage, the sending-out transfer unit 111 is disposed at the downstream end of the carrying passage, and the developer pouring nozzle 151, the cleaning nozzle 152 and the gas nozzle 154 are arranged in that order from the upstream side. Driving mechanisms for moving the carrying members 120 and the mesh belt 125 respectively along the orbital paths are not limited to the above-mentioned driving mechanisms. The main arm of the DEV layer B1 may be a main arm that moves, similarly to the main arm of the COT layer B2, along the length of the carrying area.

The present invention is applicable to forming only a resist film and to forming an antireflection film on a resist film. When an antireflection film is formed on a resist film, a unit block for forming the antireflection film is needed. This unit block is the same in construction as the unit block for forming the antireflection film underlying the resist film. The present invention is applicable to forming a resist film, an antireflection film underlying the resist film, and an antireflection film overlying the resist film. When a resist film, an antireflection film underlying the resist film, and an antireflection film overlying the resist film are to be formed, a developing unit block, a resist film forming unit block for forming a resist film, an antireflection film forming unit block for forming the antireflection film underlying the resist film, and an antireflection film forming unit block for forming the antireflection film overlying the resist film are stacked up in layers to build a processing block. According to the present invention, order of stacking up the unit blocks is optional, provided that the processing block includes a film forming unit block and a developing unit block. The shelf units U1, U2, U3, U4, U11 and U21 may be provided with modules other than the above-mentioned modules. The respective numbers of the transfer modules of the shelf units U1, U11, U3, U4 and U21 may be greater than those mentioned above. A module capable of serving as a temperature adjusting mechanism and a transfer unit may be employed The shelf units U1, U2, U3, U4, U11 and U21 may be provided with hydrophobicity imparting modules, respectively, and may be provided with inspection units for measuring the thickness of a film formed on a wafer W and for inspecting a wafer W for warping.

The present invention is applicable not only to a coating and developing system for processing a semiconductor wafer, but also to a coating and developing system for processing a substrate, such as a glass substrate for a liquid crystal display, namely, an LCD substrate.

What is claimed is:

1. A coating and developing system, comprising:
    a film forming unit block disposed behind a carrier block to form films including a resist film on a substrate carried in a carrier delivered to the carrier block;
    an interface block disposed behind the film forming unit block to transfer the substrate provided with the films including the resist film to an exposure system; and
    a developing unit block disposed on the film forming unit block to process the substrate returned from the exposure system through the interface block by a developing process, the developing unit block including a substrate carrying passage, along which the substrate is carried from the interface block toward the carrier block and the substrate processed by the developing process is transferred to the carrier block,
    wherein the developing unit block further includes developing modules for processing a substrate by the developing process, and a substrate carrying means for carrying a substrate to and receiving a substrate from the developing modules, and
    wherein each of the developing modules includes:
        a pair of rotating members respectively having horizontal axes of rotation parallel to each other and disposed longitudinally opposite to each other,
        a carrying passage forming mechanism extended between the rotating members, capable of moving along an orbital path and forming a part of the carrying passage for the substrate supported thereon,
        a sending-in transfer unit disposed at an upstream end of the carrying passage to transfer a substrate from the substrate carrying means to the carrying passage forming mechanism, a sending-out transfer unit disposed at a downstream end of the carrying passage to transfer a substrate from the carrying passage forming mechanism to the substrate carrying means, a developer pouring nozzle for pouring a developer onto a substrate, a cleaning liquid pouring nozzle for pouring a cleaning liquid onto a substrate, and a gas blowing nozzle for blowing a gas against a substrate, arranged in that order from an upstream side toward a downstream side of the carrying passage between the upstream and the downstream end of the carrying passage.

2. The coating and developing system according to claim 1, wherein the carrying passage forming mechanism includes: a plurality of bar-shaped carrying members for supporting a substrate thereon, extending parallel to the axes of rotation, and a pair of timing belts connected to the opposite ends of the rotating members and capable of moving along the orbital path.

3. The coating and developing system according to claim 2, further comprising a motor for driving at least one of the pair of rotating members to move the timing belts along the orbital path.

4. The coating and developing system according to claim 3, further comprising a mesh belt having a side extending between a substrate on the carrying passage and the developer pouring nozzle, the mesh belt being capable of moving in synchronism with movement of the substrate.

5. The coating and developing system according to claim 3, wherein the substrate carrying means includes:

a sending-in substrate carrying means for transferring a substrate to the sending-in transfer unit, and a sending-out substrate carrying means for receiving a substrate from the sending-out transfer unit.

6. The coating and developing system according to claim 3, wherein the developing modules include a substrate carrying passage formed by the carrying passage forming mechanism such that the substrate carrying passage extends along a substrate carrying passage in the developing unit block, the sending-in transfer unit is on a side of the interface block, and the sending-out transfer unit is on a side of the carrier block, wherein the developing unit block further includes a shelf unit having a plurality of pretreatment modules for processing a substrate before the substrate is subjected to the developing process and a plurality of posttreatment modules for processing a substrate processed by the developing process, and wherein the shelf unit is disposed opposite to the developing modules with respect to the substrate carrying passage in the developing unit block.

7. The coating and developing system according to claim 2, wherein the timing belts of the carrying passage forming mechanism include, at least on outer surfaces thereof, driving electromagnets arranged such that N poles and S poles are arranged alternately, and wherein the driving electromagnets, for driving the timing belts for the movement along the orbital path, have changeable magnetic properties and are arranged such that N poles and S poles are arranged alternately.

8. The coating and developing system according to claim 2 further comprising a mesh belt having a side extending between a substrate on the carrying passage and the developer pouring nozzle, the mesh belt being capable of moving in synchronism with movement of the substrate.

9. The coating and developing system according to claim 2, wherein the substrate carrying means includes:

a sending-in substrate carrying means for transferring a substrate to the sending-in transfer unit, and a sending-out substrate carrying means for receiving a substrate from the sending-out transfer unit.

10. The coating and developing system according to claim 2, wherein the developing modules include a substrate carrying passage formed by the carrying passage forming mechanism such that the substrate carrying passage extends along a substrate carrying passage in the developing unit block, the sending-in transfer unit is on a side of the interface block, and the sending-out transfer unit is on a side of the carrier block, wherein the developing unit block further includes a shelf unit having a plurality of pretreatment modules for processing a substrate before the substrate is subjected to the developing process, and a plurality of posttreatment modules for processing a substrate processed by the developing process, and wherein the shelf unit is disposed opposite to the developing modules with respect to the substrate carrying passage in the developing unit block.

11. The coating and developing system according to claim 10, wherein, in the carrying passage in the developing unit block, a sending-in substrate carrying means is disposed on the side of the interface block, a sending-out substrate carrying means is disposed on the side of the carrier block, a substrate is transferred to and received from the plurality of pretreatment modules of the shelf unit by the sending-in substrate carrying means, and a substrate is transferred to and received from the posttreatment modules of the shelf unit by the sending-out substrate carrying means.

12. The coating and developing system according to claim 1, further comprising a motor for driving at least one of the pair of rotating members to move timing belts along the orbital path.

13. The coating and developing system according to claim 1, wherein the carrying passage forming mechanism includes timing belts, the timing belts including, at least on outer surfaces thereof, driving electromagnets arranged such that N poles and S poles are arranged alternately, and wherein driving electromagnets, for driving the timing belts for movement along the orbital path, have changeable magnetic properties and are arranged such that N poles and S poles are arranged alternately.

14. The coating and developing system according to claim 1, further comprising a mesh belt having a side extending between a substrate on the carrying passage and the developer pouring nozzle, the mesh belt being capable of moving in synchronism with movement of the substrate.

15. The coating and developing system according to claim 1, wherein the substrate carrying means includes:

a sending-in substrate carrying means for transferring a substrate to the sending-in transfer unit, and a sending-out substrate carrying means for receiving a substrate from the sending-out transfer unit.

16. The coating and developing system according to claim 1, wherein the developing modules include a substrate carrying passage formed by the carrying passage forming mechanism such that the substrate carrying passage extends along a substrate carrying passage in the developing unit block, the sending-in transfer unit is on a side of the interface block, and the sending-out transfer unit is on the a side of the carrier block, wherein the developing unit block further includes a shelf unit having a plurality of pretreatment modules for processing a substrate before the substrate is subjected to the developing process, and a plurality of posttreatment modules for processing a substrate processed by the developing process, and wherein the shelf unit is disposed opposite to the developing modules with respect to the substrate carrying passage in the developing unit block.

17. The coating and developing system according to claim 16, wherein, in the carrying passage in the developing unit block, a sending-in substrate carrying means is disposed on the side of the interface block, a sending-out substrate carrying means is disposed on the side of the carrier block, a substrate is transferred to and received from the plurality of pretreatment modules of the shelf unit by the sending-in substrate carrying means, and a substrate is transferred to and received from the posttreatment modules of the shelf unit by the sending-out substrate carrying means.

18. A coating and developing method for forming films including a resist film on a substrate carried in a carrier delivered to a carrier block by a film forming unit block disposed behind the carrier block, carrying the substrate through an interface block disposed behind the film forming unit block to an exposure system, processing the substrate returned through the interface block from the exposure system by a developing process by a developing unit block put on the film forming unit block and provided with a substrate carrying passage extending from the interface block toward the carrier block, and transferring the substrate to the carrier block, the developing unit block being provided with developing modules for processing a substrate by the developing process, and a substrate carrying means for carrying a substrate to and receiving a substrate from the developing modules, and each of the developing modules being provided with a pair of rotating members respectively having horizontal axes of rotation parallel to each other, and disposed longitudinally opposite to each other, a carrying passage forming mechanism extended between the rotating members, capable of moving along an orbital path and forming a part of the carrying passage for the substrate supported thereon, said coating and developing method comprising the steps of:

transferring a substrate from the substrate carrying means to the carrying passage forming mechanism by a sending-in transfer unit disposed at an upstream end of the carrying passage;

pouring a developer onto the substrate while the substrate is being carried downstream by the carrying passage forming mechanism;

pouring a cleaning liquid onto the substrate while the substrate is being carried downstream by the carrying passage forming mechanism;

blowing a dry gas against the substrate while the substrate is being carried downstream by the carrying passage forming mechanism;

transferring the substrate from the carrying passage forming mechanism to the substrate carrying means after moving the substrate to a sending-out transfer unit disposed at a downstream end of a carrying passage by the carrying passage forming mechanism; and moving the carrying passage forming mechanism not carrying any substrate along the orbital path to return the carrying passage forming mechanism from the sending-out transfer unit to the sending-in transfer unit.

19. The coating and developing method according to claim 18, wherein the substrate carrying means includes a sending-in substrate carrying means and a sending-out substrate carrying means, wherein the substrate is transferred from the sending-in substrate carrying means to the carrying passage forming mechanism at the sending-in transfer unit, and wherein the substrate is transferred from the carrying passage forming mechanism to the sending-out substrate carrying means at the sending-out transfer unit.

20. A non-transitory storage medium storing a computer program to be executed by a coating and developing system that forms films including a resist film on a substrate received from a carrier block and processes the substrate processed by an exposure process by a developing process, wherein the computer program is a set of instructions specifying steps of the coating and developing method set forth in claim 18.

* * * * *